US012672416B2

(12) United States Patent
Lee et al.

(10) Patent No.: US 12,672,416 B2
(45) Date of Patent: Jun. 30, 2026

(54) DISPLAY DEVICE AND LIGHT EMITTING ELEMENT

(71) Applicant: Samsung Display Co., LTD., Yongin-si (KR)

(72) Inventors: Seung A Lee, Yongin-si (KR); Bong Chun Park, Yongin-si (KR); Kwan Jae Lee, Yongin-si (KR); Dong Eon Lee, Yongin-si (KR); So Young Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 379 days.

(21) Appl. No.: 18/536,838

(22) Filed: Dec. 12, 2023

(65) Prior Publication Data

US 2024/0379728 A1      Nov. 14, 2024

(30) Foreign Application Priority Data

May 12, 2023     (KR) ........................ 10-2023-0062023

(51) Int. Cl.
| | |
|---|---|
| *H10H 29/14* | (2025.01) |
| *H10H 20/821* | (2025.01) |
| *H10H 20/825* | (2025.01) |
| *H10H 20/84* | (2025.01) |
| *H10H 20/851* | (2025.01) |
| *H10H 20/80* | (2025.01) |

(52) U.S. Cl.
CPC ........ *H10H 29/142* (2025.01); *H10H 20/821* (2025.01); *H10H 20/825* (2025.01); *H10H*

*20/84* (2025.01); *H10H 20/851* (2025.01); *H10H 20/882* (2025.01)

(58) Field of Classification Search
CPC ... H10H 29/142; H10H 20/821; H10H 20/825
See application file for complete search history.

(56) References Cited

U.S. PATENT DOCUMENTS

| | | | |
|---|---|---|---|
| 11,075,320 | B2 | 7/2021 | Yamashita |
| 2021/0202450 | A1 | 7/2021 | Min et al. |
| 2021/0320231 | A1 | 10/2021 | Kim et al. |

(Continued)

FOREIGN PATENT DOCUMENTS

| | | |
|---|---|---|
| JP | 2006-339550 | 12/2006 |
| JP | 2012-030991 | 2/2012 |

(Continued)

*Primary Examiner* — Anthony Ho
(74) *Attorney, Agent, or Firm* — Womble Bond Dickinson (US) LLP

(57)         ABSTRACT

A display device includes a first electrode and a second electrode, spaced apart from each other, and light emitting elements disposed between the first electrode and the second electrode. Each of the light emitting elements includes a first semiconductor layer, a second semiconductor layer disposed on the first semiconductor layer, and an active layer disposed between the first semiconductor layer and the second semiconductor layer. A thickness of the active layer is in a range of about 1 nm to about 2.8 nm, the active layer includes $InGa_{1-x}N$ (about $0.18 \leq x \leq$ about 0.20). The light emitting elements emit light with a wavelength in a range of about 462 nm to about 472 nm in a current density in a range of about 0.5 A/cm$^2$ to about 100 A/cm$^2$.

20 Claims, 12 Drawing Sheets

(56)         References Cited

U.S. PATENT DOCUMENTS

| | | |
|---|---|---|
| 2022/0285582 A1 | 9/2022 | Lee et al. |
| 2022/0344536 A1 | 10/2022 | Lee et al. |

FOREIGN PATENT DOCUMENTS

| | | |
|---|---|---|
| JP | 6928277 | 9/2021 |
| KR | 10-2020-0029100 | 3/2020 |
| KR | 10-2520554 | 4/2023 |
| WO | 2005/022711 | 3/2005 |

DISPLAY DEVICE AND LIGHT EMITTING ELEMENT

CROSS REFERENCE TO RELATED APPLICATION(S)

This application claims priority to and benefits of Korean Patent Application No. 10-2023-0062023 under 35 U.S.C. § 119, filed on May 12, 2023, in the Korean Intellectual Property Office (KIPO), the entire contents of which are incorporated herein by reference.

BACKGROUND

1. Technical Field

Embodiments relate to a display device and a light emitting element.

2. Description of the Related Art

Recently, as interest in information displays is increased, research and development of display devices have been continuously conducted.

SUMMARY

The disclosure provides a display device with improved reliability of a light emitting element.

In accordance with an embodiment, a display device may include a first electrode and a second electrode, spaced apart from each other, and light emitting elements disposed between the first electrode and the second electrode. Each of the light emitting elements may include a first semiconductor layer, a second semiconductor layer disposed on the first semiconductor layer, and an active layer disposed between the first semiconductor layer and the second semiconductor layer. A thickness of the active layer may be in a range of about 1 nm to about 2.8 nm, and the active layer may include $InGa_{1-x}N$ (about $0.18 \leq x \leq$ about $0.20$). The light emitting elements may emit light with a wavelength in a range of about 462 nm to about 472 nm in a current density in a range of about 0.5 A/cm$^2$ to about 100 A/cm$^2$.

The first electrode may overlap the first semiconductor layer in a plan view, and the second electrode may overlap the second semiconductor layer in a plan view.

The display device may further include a first connection electrode and a second connection electrode, disposed on the light emitting elements.

The first connection electrode may be electrically connected to the first semiconductor layer, and the second connection electrode may be electrically connected to the second semiconductor layer.

The first connection electrode may be electrically connected to the first electrode, and the second connection electrode may be electrically connected to the second electrode.

The display device may further include a color conversion layer disposed on the light emitting elements.

The color conversion layer may include a first color conversion layer, a second color conversion layer, and a light scattering layer.

The first color conversion layer may include a first quantum dot, and the second color conversion layer may include a second quantum dot.

The light scattering layer may include a light scattering particle.

The display device may further include a color filter layer disposed on the color conversion layer.

The color filter layer may include a first color filter overlapping the first color conversion layer in a plan view, a second color filter overlapping the second color conversion layer in a plan view, and a third color filter overlapping the light scattering layer in a plan view.

The display device may further include a light blocking layer disposed between the first, second, and third color filters.

The thickness of the active layer may be in a range of about 1 nm to about 2.4 nm.

The light emitting elements may emit light with a wavelength in a range of about 466 nm to about 469 nm in a current density of about 12 A/cm$^2$.

A thickness of each of the light emitting elements may be less than or equal to about 4 μm.

In accordance with an embodiment, a light emitting element may include a first semiconductor layer, a second semiconductor layer disposed on the first semiconductor layer, and an active layer disposed between the first semiconductor layer and the second semiconductor layer. A thickness of the active layer may be in a range of about 1 nm to about 2.8 nm, the active layer may include $InGa_{1-x}N$ (about $0.18 \leq x \leq$ about $0.20$). The light emitting element may emit light with a wavelength in a range of about 462 nm to about 472 nm in a current density in a range of about 0.5 A/cm$^2$ to about 100 A/cm$^2$.

The thickness of the active layer may be in a range of about 1 nm to about 2.4 nm.

The light emitting element may emit light with a wavelength in a range of about 466 nm to about 469 nm in a current density of about 12 A/cm$^2$.

The light emitting element may further include an electrode layer disposed on the first semiconductor layer.

The light emitting element may further include an insulative film surrounding the first semiconductor layer, the active layer, and the second semiconductor layer.

BRIEF DESCRIPTION OF THE DRAWINGS

The embodiments will now be described more fully hereinafter with reference to the accompanying drawings, however, the disclosure may be embodied in different forms and should not be construed as limited to the embodiments set forth herein. Rather, these embodiments are provided so that this disclosure will be more thorough and complete, and will fully convey the scope of the disclosure to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
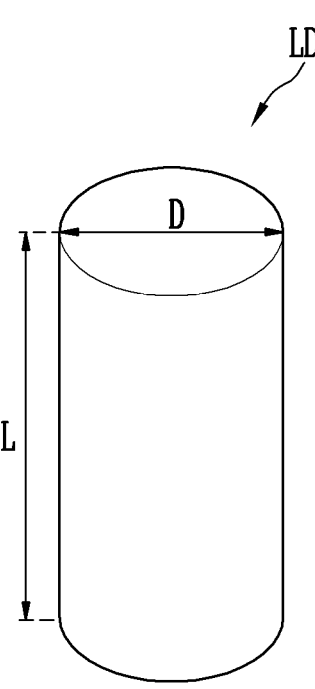
FIG. 1 is a schematic perspective view illustrating a light emitting element in accordance with an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

The effects and characteristics of the disclosure and a method of achieving the effects and characteristics will be clear by referring to the embodiments described below in detail together with the accompanying drawings. However, the disclosure is not limited to the embodiments disclosed herein but may be implemented in various forms. The embodiments are provided by way of example only so that a person of ordinary skilled in the art can fully understand the features in the disclosure and the scope thereof. Therefore, the disclosure can be defined by the scope of the appended claims.

The terminology used herein is for the purpose of describing particular embodiments only and is not construed as limiting the disclosure. As used herein, the singular forms are intended to include the plural forms as well, unless the context clearly indicates otherwise. The terms "comprises/includes/has" and/or "comprising/including/has," when used in this specification, specify the presence of mentioned component, step, operation, and/or element, but do not exclude the presence or addition of one or more other components, steps, operations, and/or elements.

As used herein, the singular forms, "a," "an," and "the" are intended to include the plural forms as well, unless the context clearly indicates otherwise. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

When described as that any element is "connected," "coupled," or "accessed" to another element, it should be understood that it is possible that still another element may "connected," "coupled," or "accessed" between the two elements as well as that the two elements are directly "connected," "coupled," or "accessed" to each other. When, however, an element or layer is referred to as being "directly connected to," "directly coupled to," or "directly accessed," another element or layer, there are no intervening elements or layers present. To this end, the term "connected" may refer to physical, electrical, and/or fluid connection, with or without intervening elements. Further, the first direction (X-axis direction), the second direction (Y-axis direction), and the third direction (Z-axis direction) are not limited to three axes of a rectangular coordinate system, such as the first to third directions (X-, Y-, and Z-axes directions), and may be interpreted in a broader sense. For example, the first direction (X-axis direction), the second direction (Y-axis direction), and the third direction (Z-axis direction) may be perpendicular to one another, or may represent different directions that are not perpendicular to one another.

The term "on" that is used to designate that an element or layer is on another element or layer includes both a case where an element or layer is located directly on another element or layer, and a case where an element or layer is located on another element or layer via still another element layer. In contrast, when an element is referred to as being "directly on" another element, no intervening elements are present. Like reference numerals generally denote like elements throughout the specification.

When a component is described herein to "connect" another component to the other component or to be "connected to" other components, the components may be connected to each other as separate elements, or the components may be integral with each other.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure.

For the purposes of this disclosure, the phrase "at least one of A and B" may be construed as A only, B only, or any combination of A and B. "At least one of X, Y, and Z," "at least two of X, Y, and Z," and "at least one selected from the group consisting of X, Y, and Z" may be construed as X only, Y only, Z only, or any combination of two or more of X, Y, and Z. Also, "at least two of X, Y, and Z," may be construed as two or more of X, Y, and Z such as both X and Y, both X and Z, both Y and Z, both X, Y, and Z.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Spatially relative terms, such as "below," "lower," "above," "upper," "over," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The display surface may be parallel to a surface defined by a first direction (X-axis direction) and a second direction (Y-axis direction). A normal direction of the display surface, i.e., a thickness direction of the display device, may indicate a third direction (Z-axis direction). In this specification, an expression of "when viewed from the top or in a plan view" may represent a case when viewed in the third direction (Z-axis direction). Hereinafter, a front surface (or a top surface) and a rear surface (or a bottom surface) of each of layers or units may be distinguished by the third direction (Z-axis direction). However, directions indicated by the first to third directions (X-, Y-, and Z-axes directions) may be a relative concept, and converted with respect to each other, e.g., converted into opposite directions.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in more detail with reference to the accompanying drawings.

Figure 2:
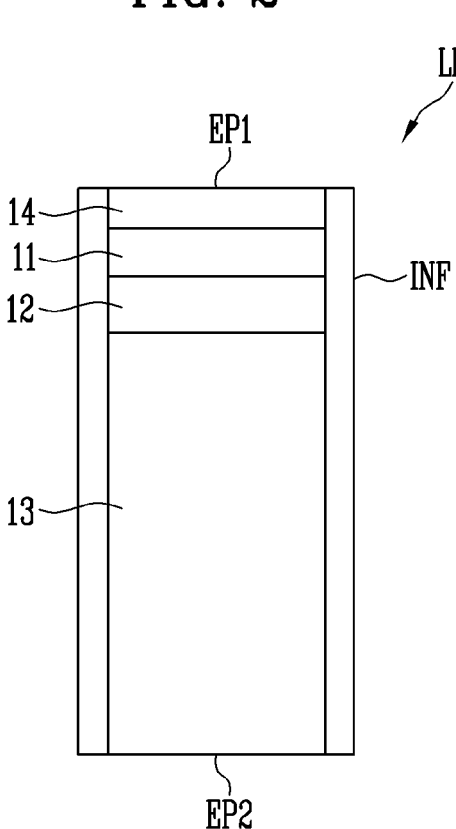
FIG. 2 is a schematic cross-sectional view illustrating the light emitting element in accordance with an embodiment of the disclosure.

FIG. 1 is a schematic perspective view illustrating a light emitting element in accordance with an embodiment of the disclosure. FIG. 2 is a schematic cross-sectional view illustrating the light emitting element in accordance with an embodiment of the disclosure. Although a pillar-shaped light emitting element LD is illustrated in FIGS. 1 and 2, the kind and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be provided in a pillar shape extending in a direction. The light emitting element LD may have a first end portion EP1 and a second end portion EP2. One of the first and second semiconductor layers 11 and 13 may be disposed at the first end portion EP1 of the light emitting element LD. Another one of the first and second semiconductor layers 11 and 13 may be disposed at the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

In an embodiment, the light emitting element LD may be a light emitting element manufactured in a pillar shape by an etching process or the like. In this specification, the term "pillar shape" may include a rod-like shape or bar-like shape, of which aspect ratio is greater than 1, such as a cylinder, a polyprism, or the like, but the shape of the light emitting element LD is not limited thereto.

The light emitting element LD may have a small size in a range of nanometer scale to micrometer scale. The light emitting element LD may have a diameter D (or width) in a range of nanometer scale to micrometer scale and/or a length L in a range of nanometer scale to micrometer scale. In an embodiment, the length L of the light emitting element LD may be less than or equal to about 4 μm. As such, in case that the size of the light emitting element LD is small, a reliability problem may be caused, and luminance may be deteriorated due to surface damage of the light emitting element LD. Accordingly, in the light emitting element LD in accordance with an embodiment of the disclosure, indium (In) content (or composition) and thickness of the active layer 12 may be controlled, thereby improving a reliability of the light emitting element LD.

However, the size of the light emitting element LD is not limited thereto, and the size of the light emitting element LD may be variously changed according to design conditions of various devices, e.g., a display device, and the like, which use, as a light source, a light emitting device using the light emitting element LD.

The first semiconductor layer 11 may be a first conductivity type semiconductor layer. For example, the first semiconductor layer 11 may include a p-type semiconductor layer. In an embodiment, the first semiconductor layer 11 may include at least one semiconductor material such as InAlGaN, GaN, AlGaN, InGaN, and AlN, and may include a p-type semiconductor layer doped with a first conductivity type dopant such as Mg or the like. However, the material constituting the first semiconductor layer 11 is not limited thereto. The first semiconductor layer 11 may include various materials.

The active layer 12 may be disposed between the first semiconductor layer 11 and the second semiconductor layer 13. The active layer 12 may include one structure among a single well structure, a multi-well structure, a single quantum well structure, a multi-quantum well (MQW) structure, a quantum dot structure, and a quantum wire structure, but the disclosure is not necessarily limited thereto. In an embodiment, the active layer 12 may include GaN, InGaN, InAlGaN, AlGaN, AlN, the like, or a combination thereof. The active layer 12 may include various materials. In case that a voltage which is a threshold voltage or more is applied to ends of the light emitting element LD, the light emitting element LD may emit light as electron-hole pairs are combined in the active layer 12. The light emission of the light emitting element LD may be controlled by using such a principle, and the light emitting element LD may be used as a light source for various light emitting devices, including a pixel (see, e.g., PXL of FIG. 3) of a display device.

In an embodiment, a thickness of the active layer 12 may be in a range of about 1 nm to about 2.8 nm in an axial direction (or a length direction L) of the light emitting element LD. In an embodiment, the thickness of the active layer 12 may be in a range of about 1 nm to about 2.4 nm. The active layer 12 may include $InGa_{1-x}N$ (about $0.18 \leq x \leq$ about 0.20). In an embodiment, an indium (In) composition of the active layer 12 may be uniform in a length L direction, and may have another distribution in a diameter D direction of the light emitting element LD. As such, in case that the indium (In) composition of the active layer 12 is non-uniformly formed in the diameter D direction of the light emitting element LD, it may be advantageous in characteristic improvement of the light emitting element LD. However, the disclosure is not necessarily limited thereto, and the indium (In) composition of the active layer 12 may have various distributions in the length L or diameter D direction of the light emitting element LD.

The active layer 12 may emit light with a wavelength in a range of about 462 nm to about 472 nm in a current density in a range of about 0.5 A/cm² to about 100 A/cm². In an embodiment, the active layer 12 may emit light with a wavelength in a range of about 466 nm to about 469 nm in a current density of about 12 A/cm². For example, the indium (In) content may become high as a growth temperature of the active layer 12 becomes low, and the thickness of the active layer 12 may be decreased as the growth time of the active layer 12 is decreased. However, the disclosure is not necessarily limited thereto.

As described above, the indium (In) content and thickness of the active layer 12 may be controlled, so that luminance deterioration due to surface damage may be minimized, and the reliability of the light emitting element LD may be improved.

The second semiconductor layer 13 may be disposed on the active layer 12, and may include a semiconductor layer. A type of the second semiconductor layer 13 and a type of the first semiconductor layer 11 may be different from each other. For example, the second semiconductor layer 13 may include an n-type semiconductor layer. In an embodiment, the second semiconductor layer 13 may include a semiconductor material such as InAlGaN, GaN, AlGaN, InGaN, and AlN, and may include an n-type semiconductor layer doped with a second conductivity type dopant such as Si, Ge, Sn, the like, or a combination thereof. However, the material constituting the second semiconductor layer 13 is not limited thereto. The second semiconductor layer 13 may include various materials.

The electrode layer 14 may be disposed on the first end portion EP1 and/or the second end portion EP2 of the light emitting element LD. Although FIG. 2 illustrates that the electrode layer 14 is formed on the first semiconductor layer 11, the disclosure is not necessarily limited thereto. In another embodiment, a separate electrode layer may be further disposed on the second semiconductor layer 13.

The electrode layer 14 may include a transparent metal, a transparent metal oxide, or the like. In an embodiment, the electrode layer 14 may include at least one of indium tin oxide (ITO), indium zinc oxide (IZO), and zinc tin oxide (ZTO), but the disclosure is not necessarily limited thereto. In case that the electrode layer 14 may include a transparent metal or a transparent metal oxide, light generated in the active layer 12 of the light emitting element LD may pass through the electrode layer 14 and be emitted to an outside of the light emitting element LD.

An insulative film INF may be provided on a surface of the light emitting element LD. The insulative film INF may be disposed (e.g., disposed directly) on surfaces of the first semiconductor layer 11, the active layer 12, the second semiconductor layer 13, and/or the electrode layer 14. The insulative film INF may expose the first and second end portions EP1 and EP2 of the light emitting element LD, which have different polarities.

The insulative film INF may prevent an electrical short circuit which may occur in case that the active layer 12 contacts a conductive material except the first and second semiconductor layers 11 and 13. The insulative film INF may minimize a surface defect of light emitting elements LD, thereby improving a lifetime and light emission efficiency of the light emitting elements LD.

The insulative film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulative film INF may have a double layer, and layers constituting the double layer may include different materials. In an embodiment, the insulative film INF may have a double layer including aluminum oxide ($AlO_x$) and silicon oxide ($SiO_x$), but the disclosure is not necessarily limited thereto. In another embodiment, the insulative film INF may be omitted.

A light emitting device including the light emitting element LD may be used in various devices which require a light source, including a display device. For example, light emitting elements LD may be disposed in each pixel (see, e.g., PXL of FIG. 3) of a display panel (see, e.g., PNL of FIG. 3), and be used as a light source of each pixel. However, the application field of the light emitting element LD is not limited thereto. For example, the light emitting element LD may be used in other types of devices which require a light source, such as a lighting device or the like.

Figure 3:
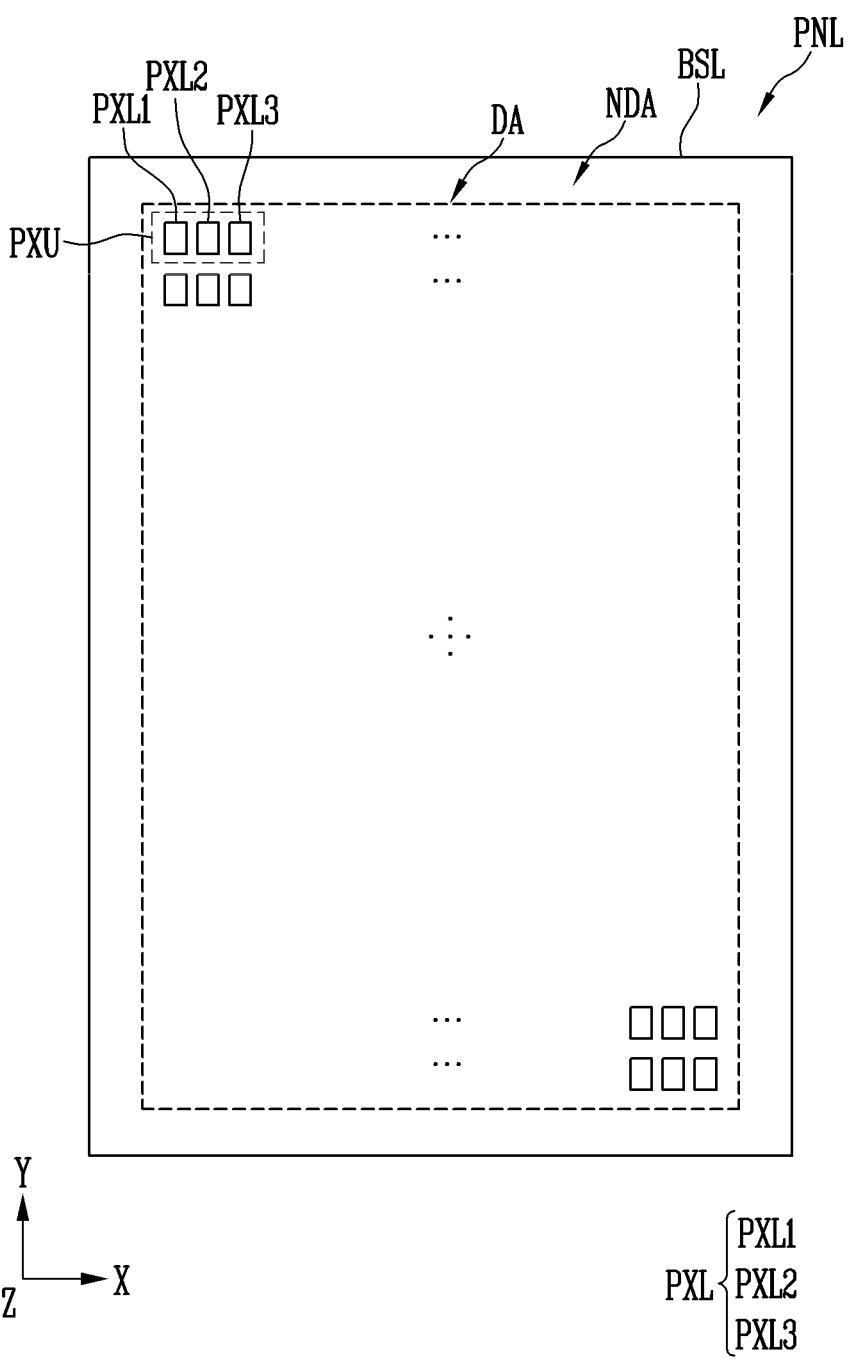
FIG. 3 is a schematic plan view illustrating a display device in accordance with an embodiment of the disclosure.

FIG. 3 is a schematic plan view illustrating a display device in accordance with an embodiment of the disclosure.

In FIG. 3, a display device, particularly, a display panel PNL provided in the display device will be illustrated as an embodiment of an electronic device which can use, as a light source, the light emitting element LD of FIGS. 1 and 2.

For convenience of description, in FIG. 3, a structure of the display panel PNL will be schematically illustrated based on a display area DA. However, in an embodiment, at least one driving circuit (e.g., at least one of a scan driver and a data driver), lines, and/or pads, which are not shown in the drawing, may be further disposed in the display panel PNL.

Referring to FIG. 3, the display panel PNL and a base layer BSL for forming the display panel PNL may include the display area DA for displaying an image and a non-display area NDA other than the display area DA. For example, the non-display area NDA may be disposed adjacent to the display area DA. For example, the non-display area NDA may surround at least a portion of the display area DA. The display area DA may constitute a screen on which the image is displayed, and the non-display area NDA may be a remaining area other than the display area DA.

A pixel unit PXU may be disposed in the display area DA. The pixel unit PXU may include a first pixel PXL1, a second pixel PXL2, and/or a third pixel PXL3. Hereinafter, in case that at least one of the first pixel PXL1, the second pixel PXL2, and the third pixel PXL3 is arbitrarily designated or in case that at least two of the first pixel PXL1, the second pixel PXL2, and the third pixel PXL3 are inclusively designated, the corresponding pixel or the corresponding pixels will be referred to as a "pixel PXL" or "pixels PXL."

In an embodiment, the pixels PXL may be arranged (e.g., regularly arranged) according to a stripe structure, a Pen-Tile™ structure, or the like. However, the arrangement structure of the pixels PXL is not limited thereto, and the pixels PXL may be arranged in the display area DA by using various structures and/or methods.

In an embodiment, at least two of pixels PXL emitting lights of different colors may be disposed in the display area DA. In an embodiment, first pixels PXL1 emitting light of a first color, second pixels PXL2 emitting light of a second color, and third pixels PXL3 emitting light of a third color may be arranged in the display area DA. At least one first pixel PXL1, at least one second pixel PXL2, and at least one third pixel PXL3, which are disposed adjacent to each other, may constitute one pixel unit PXU capable of emitting lights of various colors. For example, each of the first to third pixels PXL1, PXL2, and PXL3 may be a pixel emitting light of a color (e.g., a predetermined or selectable color). In an embodiment, the first pixel PXL1 may be a red pixel emitting light of red, the second pixel PXL2 may be a green pixel emitting light of green, and the third pixel PXL3 may be a blue pixel emitting light of blue. However, the disclosure is not limited thereto.

In an embodiment, the first pixel PXL1, the second pixel PXL2, and the third pixel PXL3 may have light emitting elements LD emitting light of a same color, and may include color conversion layers and/or color filters of different colors, which are disposed on the respective light emitting elements LD, and may respectively emit lights of the first color, the second color, and the third color. In another embodiment, the first pixel PXL1, the second pixel PXL2, and the third pixel PXL3 may respectively have, as light sources, a light emitting element LD of the first color, a light emitting element LD of the second color, and a light emitting element LD of the third color, and the light emitting elements LD may respectively emit lights of the first color, the second color, and the third color. However, the color, kind, and/or number of pixels PXL constituting each pixel unit PXU are not particularly limited thereto. The color of light emitted by each pixel PXL may be variously changed.

The pixel PXL may include at least one light source driven by a control signal (e.g., a predetermined or selectable control signal such as, a scan signal, a data signal, or the like) and/or a power source (e.g., a predetermined or selectable power source such as, a first power source, a second power source, or the like). In an embodiment, the light source may include at least one light emitting element LD in accordance with an embodiment of FIGS. 1 and 2, e.g., a subminiature pillar-shaped light emitting element LD having a small size in a range of nanometer scale to micrometer scale. However, the disclosure is not necessarily limited thereto. Various light emitting elements LD may be the light source of the pixel PXL.

In an embodiment, each pixel PXL may be configured as an active pixel. However, the kind, structure, and/or driving method of pixels PXL which can be applied to the display device are not particularly limited thereto. In another embodiment, each pixel PXL may be configured as a pixel of a passive or active light emitting display device using various structures and/or driving methods.

Figure 4:
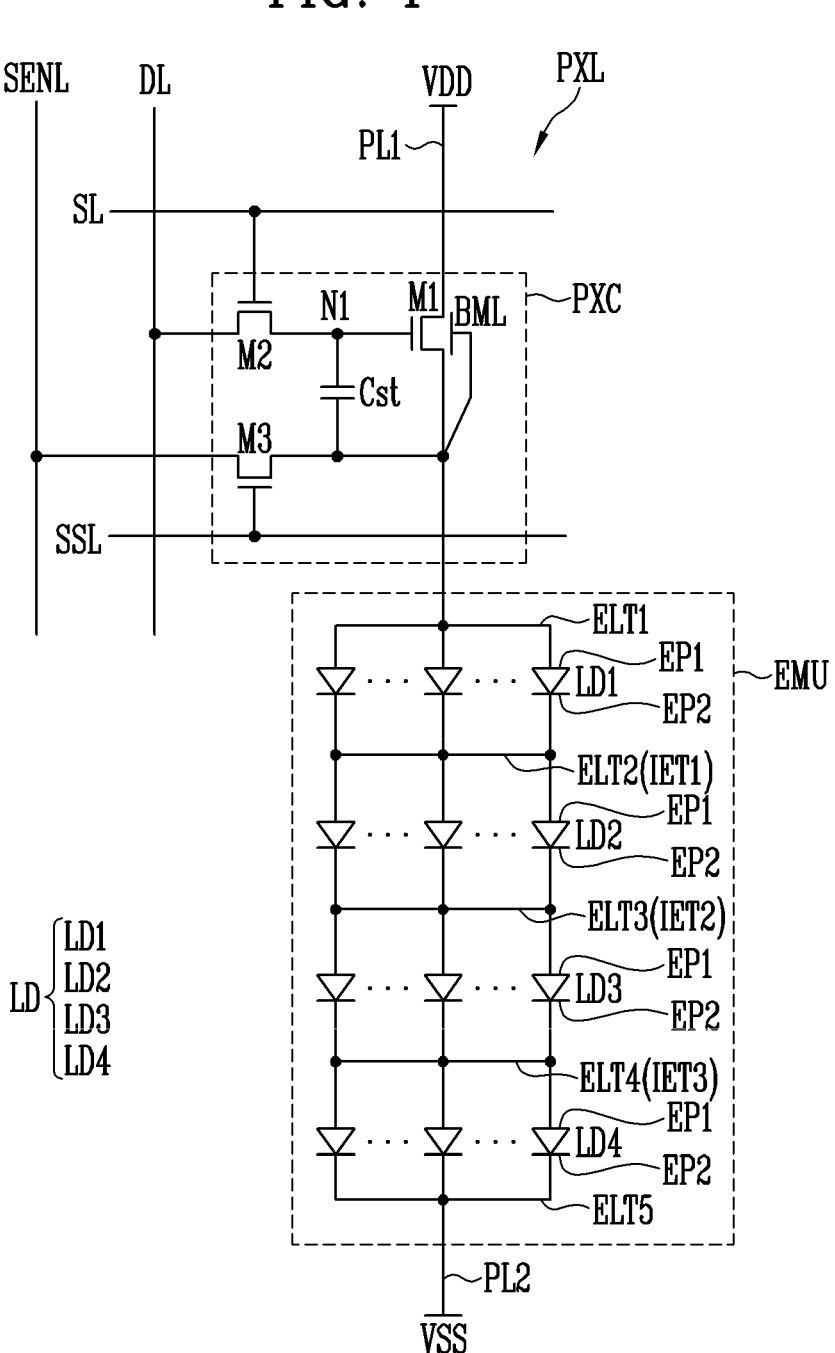
FIG. 4 is a schematic diagram of an equivalent circuit illustrating a pixel in accordance with an embodiment of the disclosure.

FIG. 4 is a schematic diagram of an equivalent circuit illustrating a pixel in accordance with an embodiment of the disclosure.

The pixel PXL shown in FIG. 4 may be one of the first pixel PXL1, the second pixel PXL2, and the third pixel PXL3, which are provided in the display panel PNL of FIG. 3. The first pixel PXL1, the second pixel PXL2, and the third pixel PXL3 may have structures substantially identical or similar to one another.

Referring to FIG. 4, the pixel PXL may include a light emitting part EMU for generating light with a luminance corresponding to a data signal and a pixel circuit PXC for driving the light emitting part EMU.

The pixel circuit PXC may be electrically connected between a first power source VDD and the light emitting part EMU. The pixel circuit PXC may be electrically connected to a scan line SL and a data line DL of the corresponding pixel PXL, and may control an operation of the light emitting part EMU, corresponding to a scan signal and the data signal, which are supplied from the scan line SL and the data line DL. The pixel circuit PXC may be selectively further electrically connected to a sensing signal line SSL and a sensing line SENL.

The pixel circuit PXC may include at least one transistor and one capacitor. In an embodiment, the pixel circuit PXC may include a first transistor M1, a second transistor M2, a third transistor M3, and a storage capacitor Cst.

The first transistor M1 may be electrically connected between the first power source VDD and a first connection electrode ELT1. A gate electrode of the first transistor M1 may be electrically connected to a first node N1. The first transistor M1 may control a driving current supplied to the light emitting part EMU, corresponding to a voltage of the first node N1. For example, the first transistor M1 may be a driving transistor for controlling the driving current of the pixel PXL.

In an embodiment, the first transistor M1 may include (e.g., selectively include) a lower conductive layer BML (also referred to as a "lower electrode," a "back gate electrode," or a "lower light blocking layer"). The gate electrode of the first transistor M1 and the lower conductive layer BML of the first transistor M1 may overlap with each other with an insulating layer interposed between the gate electrode of the first transistor M1 and the lower conductive layer BML of the first transistor M1. In an embodiment, the lower conductive layer BML may be electrically connected to an electrode, e.g., a source or drain electrode of the first transistor M1.

In case that the first transistor M1 includes the lower conductive layer BML, there may be applied a back-biasing technique (or sync technique) for moving a threshold voltage of the first transistor M1 in a negative direction or positive direction by applying a back-biasing voltage to the lower conductive layer BML of the first transistor M1 in driving of the pixel PXL. In an embodiment, a source-sync technique may be applied by electrically connecting the lower conductive layer BML to a source electrode of the first transistor M1, so that the threshold voltage of the first transistor M1 may be moved in the negative direction or positive direction. In case that the lower conductive layer BML is disposed on the bottom of (or below) a semiconductor pattern constituting a channel of the first transistor M1, the lower conductive layer BML may serve as a light blocking pattern, thereby stabilizing operational characteristics of the first transistor M1. However, the function and/or application method of the lower conductive layer BML is not limited thereto.

The second transistor M2 may be electrically connected between the data line DL and the first node N1. A gate electrode of the second transistor M2 may be electrically connected to the scan line SL. The second transistor M2 may be turned on in case that a scan signal having a gate-on voltage (e.g., a high level voltage) is supplied from the scan line SL, and may electrically connect the data line DL and the first node N1 to each other.

A data signal of a corresponding frame may be supplied to the data line DL for each frame period. The data signal may be transferred to the first node N1 through the turned-on second transistor M2 during a period in which the scan signal having the gate-on voltage is supplied. For example, the second transistor M2 may be a switching transistor for transferring each data signal to an inside of the pixel PXL.

An electrode of the storage capacitor Cst may be electrically connected to the first node N1, and another electrode of the storage capacitor Cst may be electrically connected to a second electrode of the first transistor M1. The storage capacitor Cst may charge a voltage corresponding to the data signal supplied to the first node N1 during each frame period.

The third transistor M3 may be electrically connected between the first connection electrode ELT1 (or the second electrode of the first transistor M1) and the sensing line SENL. A gate electrode of the third transistor M3 may be electrically connected to the sensing signal line SSL. The third transistor M3 may transfer a voltage value applied to the first connection electrode ELT1 to the sensing line SENL according to a sensing signal supplied to the sensing signal line SSL. The voltage value transferred through the sensing line SENL may be provided to an external circuit (e.g., a timing controller), and the external circuit may extract characteristic information (e.g., the threshold voltage of the first transistor M1 or the like), based on the provided voltage value. The extracted characteristic information may convert image data such that a characteristic deviation between the pixels PXL is compensated.

Although FIG. 4 illustrates that the transistors included in the pixel circuit PXC are all implemented with an n-type transistor, the disclosure is not limited thereto. In another embodiment, at least one of the first to third transistors M1, M2, and M3 may be a p-type transistor.

The structure and driving method of the pixel PXL may be variously changed in an embodiment. In another embodiment, the pixel circuit PXC may be configured as a pixel circuit having various structures and/or various driving methods, (in addition to an embodiment of FIG. 4).

In another embodiment, the pixel circuit PXC may not include the third transistor M3. The pixel circuit PXC may further include other circuit elements such as a compensation transistor for compensating for the threshold voltage of the first transistor M1, etc., an initialization transistor for initializing a voltage of the first node N1 and/or the first connection electrode ELT1, an emission control transistor for controlling a period in which a driving current is supplied to the light emitting part EMU, a boosting capacitor for boosting the voltage of the first node N1, the like, or a combination thereof.

The light emitting part EMU may include at least one light emitting element LD, e.g., multiple light emitting elements LD electrically connected between the first power source VDD and a second power source VSS.

For example, the light emitting part EMU may include the first connection electrode ELT1 electrically connected to the first power source VDD through the pixel circuit PXC and a first power line PL1, a fifth connection electrode ELT5 electrically connected to the second power source VSS through a second power line PL2, and multiple light emitting elements LD electrically connected between the first connection electrode ELT1 and the fifth connection electrode ELT5.

The first power source VDD and the second power source VSS may have different potentials such that the light emitting elements LD can emit light. In an embodiment, the first power source VDD may be set as a high-potential power source, and the second power source VSS may be set as a low-potential power source.

In an embodiment, the light emitting part EMU may include at least one serial stage. Each serial stage may include a pair of electrodes (e.g., two electrodes) and at least one light emitting element LD electrically connected in a forward direction between the pair of electrodes. However, the number of serial stages constituting the light emitting part EMU and the number of light emitting elements LD constituting each serial stage are not particularly limited. In an embodiment, numbers of light emitting elements LD included in the respective serial stages may be equal to or different from each other, but a number of light emitting elements LD is not particularly limited.

For example, the light emitting part EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first connection electrode ELT1, a second connection electrode ELT2, and at least one first light emitting element LD1 electrically connected between the first connection electrode ELT1 and the second connection electrode ELT2. Each first light emitting element LD1 may be electrically connected in the forward direction between the first and second connection electrodes ELT1 and EL2. For example, a first end portion EP1 of the first light emitting element LD1 may be electrically connected to the first connection electrode ELT1, and a second end portion EP2 of the first light emitting element LD1 may be electrically connected to the second connection electrode ELT2.

The second serial stage may include the second connection electrode ELT2 and a third connection electrode ELT3, and at least one second light emitting elements LD2 electrically connected between the second connection electrode ELT2 and the third connection electrode ELT3. Each second light emitting element LD2 may be electrically connected in the forward direction between the second and third connection electrodes ELT2 and ELT3. For example, a first end portion EP1 of the second light emitting element LD2 may be electrically connected to the second connection electrode ELT2, and a second end portion EP2 of the second light emitting element LD2 may be electrically connected to the third connection electrode ELT3.

The third serial stage may include the third connection electrode ELT3 and a fourth connection electrode ELT4, and at least one third light emitting elements LD3 electrically connected between the third connection electrode ELT3 and the fourth connection electrode ELT4. Each third light emitting element LD3 may be electrically connected in the forward direction between the third and fourth connection electrodes ELT3 and ELT4. For example, a first end portion EP1 of the third light emitting element LD3 may be electrically connected to the third connection electrode ELT3, and a second end portion EP2 of the third light emitting element LD3 may be electrically connected to the fourth connection electrode ELT4.

The fourth serial stage may include the fourth connection electrode ELT4 and the fifth connection electrode ELT5, and at least one fourth light emitting elements LD4 electrically connected between the fourth connection electrode ELT4 and the fifth connection electrode ELT5. Each fourth light emitting element LD4 may be electrically connected in the forward direction between the fourth and fifth connection electrodes ELT4 and ELT5. For example, a first end portion EP1 of the fourth light emitting element LD4 may be electrically connected to the fourth connection electrode ELT4, and a second end portion EP2 of the fourth light emitting element LD4 may be electrically connected to the fifth connection electrode ELT5.

An electrode (e.g., a first electrode, such as, the first connection electrode ELT1) of the light emitting part EMU may be an anode electrode of the light emitting part EMU. Another electrode (e.g., a last electrode, such as, the fifth connection electrode ELT5) of the light emitting part EMU may be a cathode electrode of the light emitting part EMU.

The other electrodes, e.g., the second connection electrode ELT2, the third connection electrode ELT3, and/or the fourth connection electrode ELT4 of the light emitting part EMU may constitute respective intermediate electrodes. For example, the second connection electrode ELT2 may constitute a first intermediate electrode IET1, the third connection electrode ELT3 may constitute a second intermediate electrode IET2, and the fourth connection electrode ELT4 may constitute a third intermediate electrode IET3.

In case that light emitting elements LD are electrically connected in a series-parallel structure, power efficiency may be improved as compared with a case that light emitting elements LD of which number is equal to that of the light emitting elements LD are electrically connected only in parallel. In the pixel PXL in which the light emitting elements LD are electrically connected in the series-parallel structure, even in case that a short defect or the like occurs in some serial stages, a luminance may be expressed through light emitting elements LD of the other serial stage. Hence, a probability that a dark spot defect will occur in the pixel PXL may be reduced. However, the disclosure is not necessarily limited thereto, and in another embodiment, the light emitting part EMU may be configured by electrically connecting the light emitting elements LD only in series or by electrically connecting the light emitting elements LD only in parallel.

Each of the light emitting elements LD may include a first end portion EP1 (e.g., a p-type end portion) electrically connected to the first power source VDD via at least one electrode (e.g., the first connection electrode ELT1), the pixel circuit PXC, and/or the first power line PL1, and a second end portion EP2 (e.g., an n-type end portion) electrically connected to the second power source VSS via at least another electrode (e.g., the fifth connection electrode ELT5) and the second power line PL2. For example, the light emitting elements LD may be electrically connected in the forward direction between the first power source VDD and the second power source VSS. The light emitting elements LD electrically connected in the forward direction may constitute effective light sources of the light emitting part EMU.

In case that a driving current is supplied through the corresponding pixel circuit PXC, the light emitting elements LD may emit light with a luminance corresponding to the driving current. For example, during each frame period, the pixel circuit PXC may supply, to the light emitting part EMU, a driving current corresponding to a grayscale value to be expressed in a corresponding frame. Accordingly, while the light emitting elements LD emit light with the luminance corresponding to the driving current, the light emitting part EMU may express the luminance corresponding to the driving current.

Figure 5:
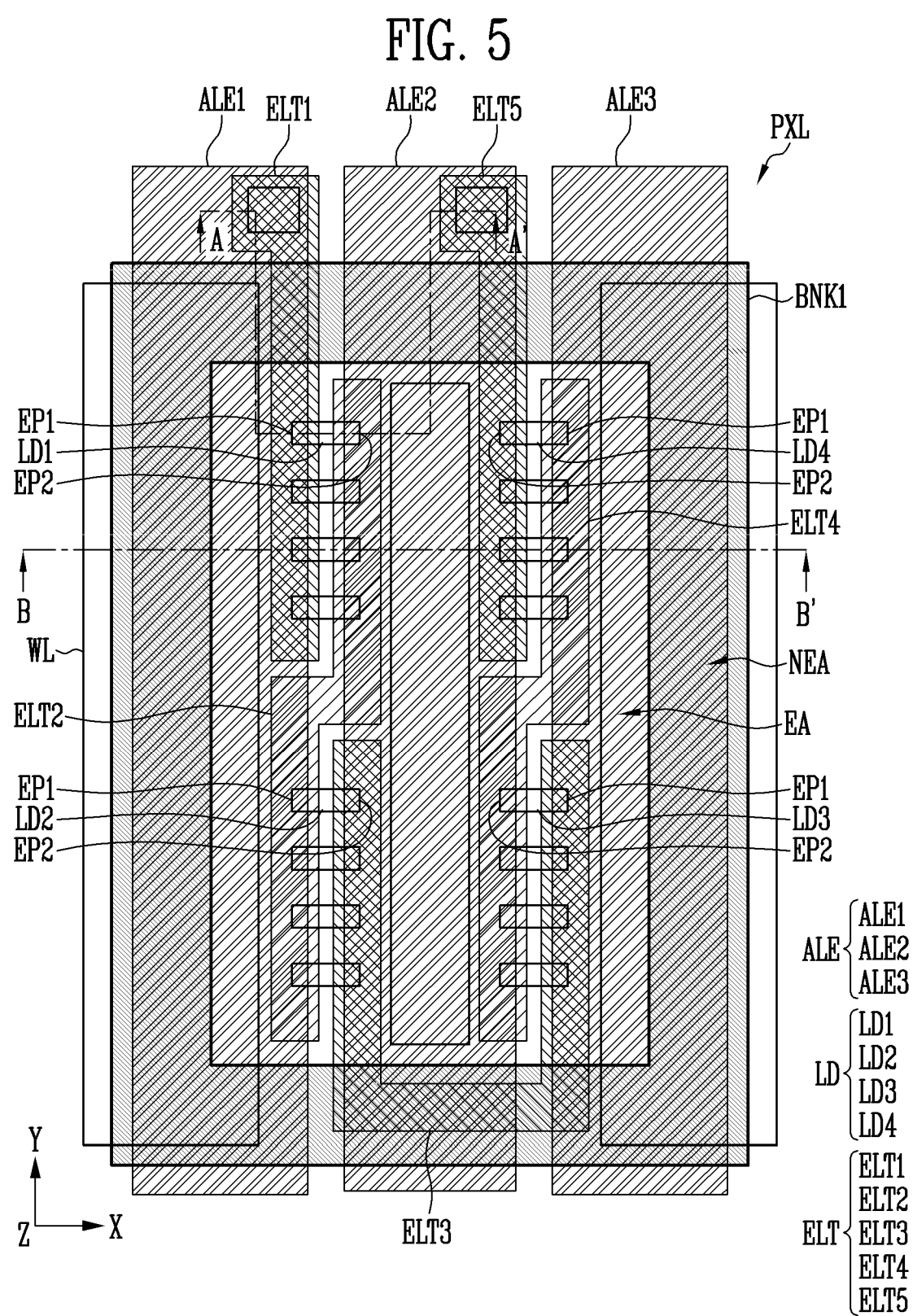
FIGS. 5 and 6 are schematic plan views illustrating a pixel in accordance with an embodiment of the disclosure.
Figure 6:
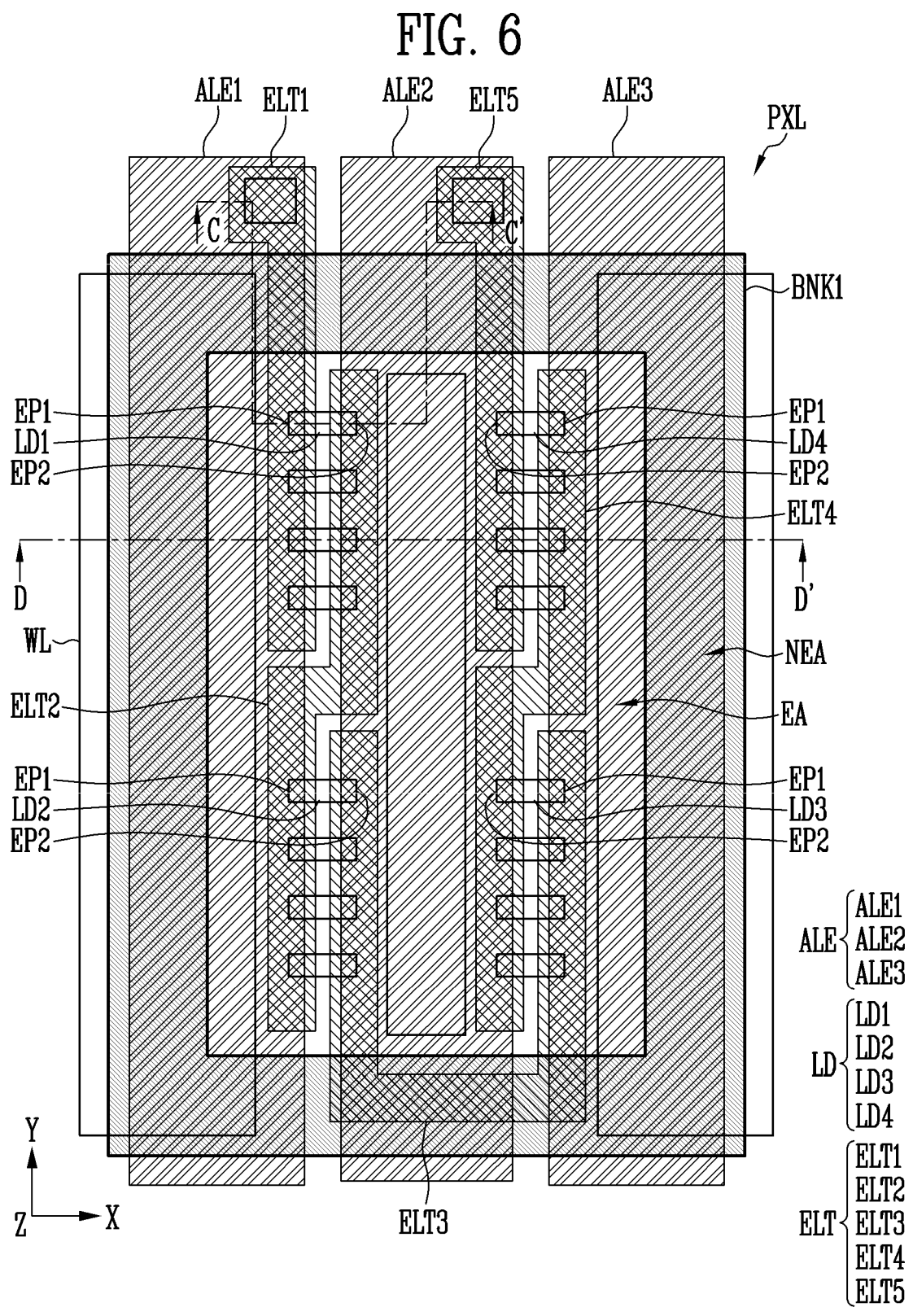
Figure 7:
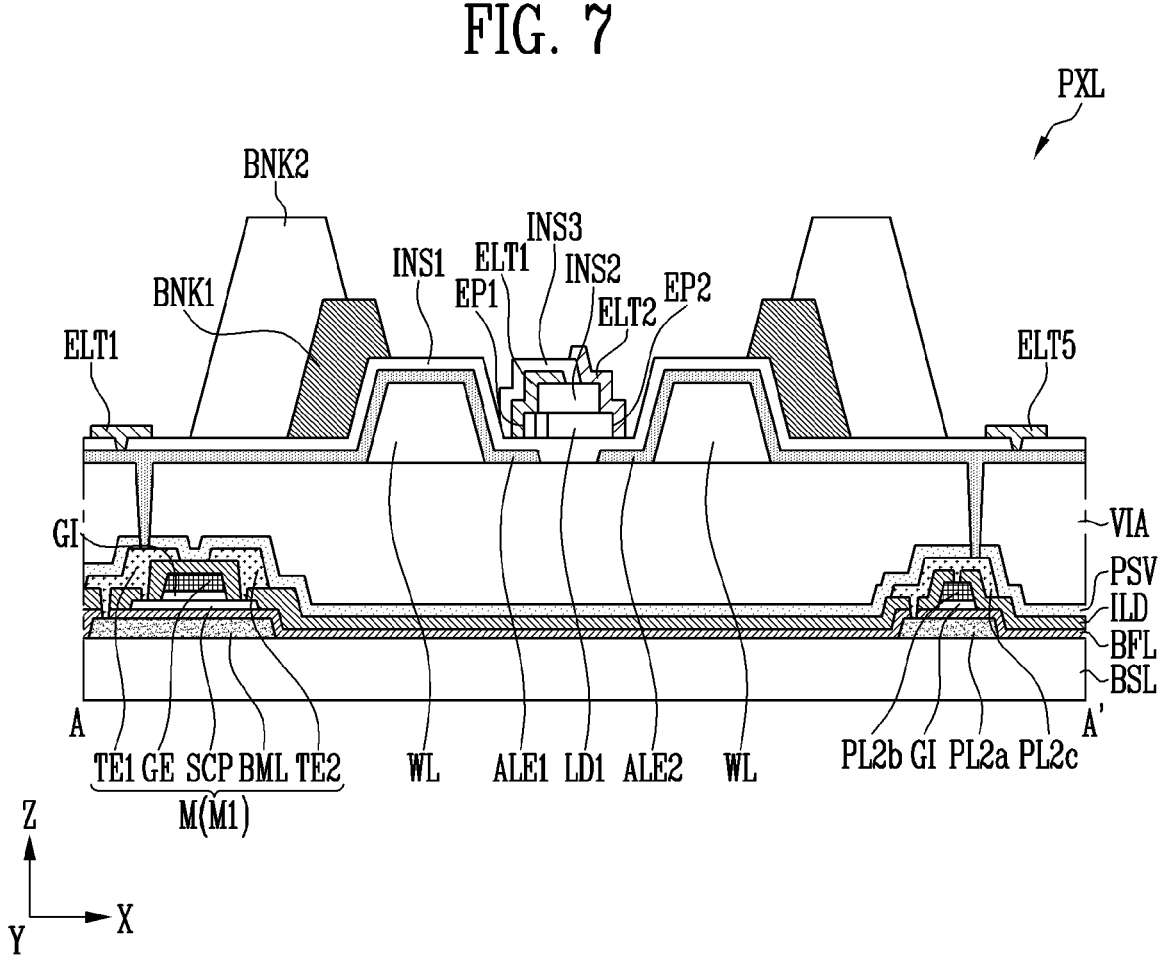
FIG. 7 is a schematic cross-sectional view taken along line A-A' shown in FIG. 5.
Figure 8:
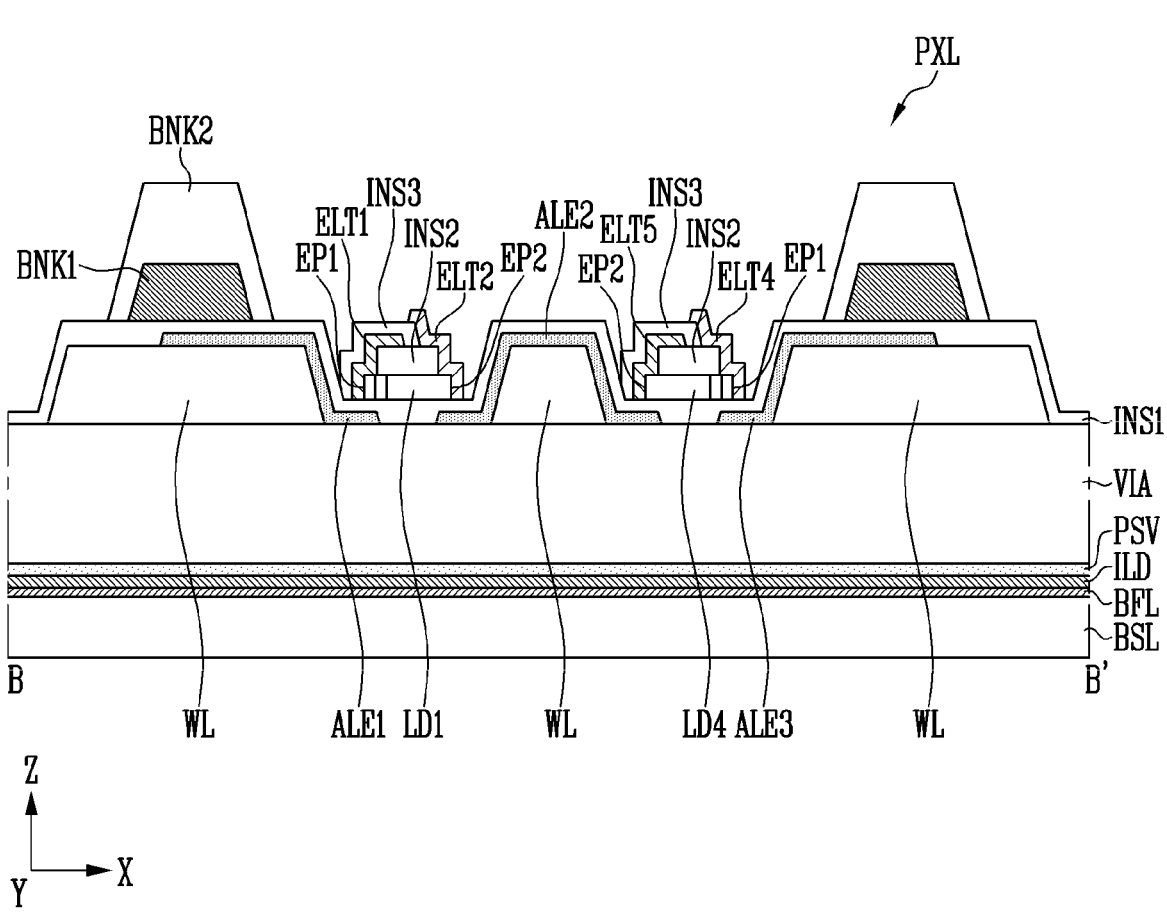
FIG. 8 is a schematic cross-sectional view taken along line B-B' shown in FIG. 5.
Figure 9:
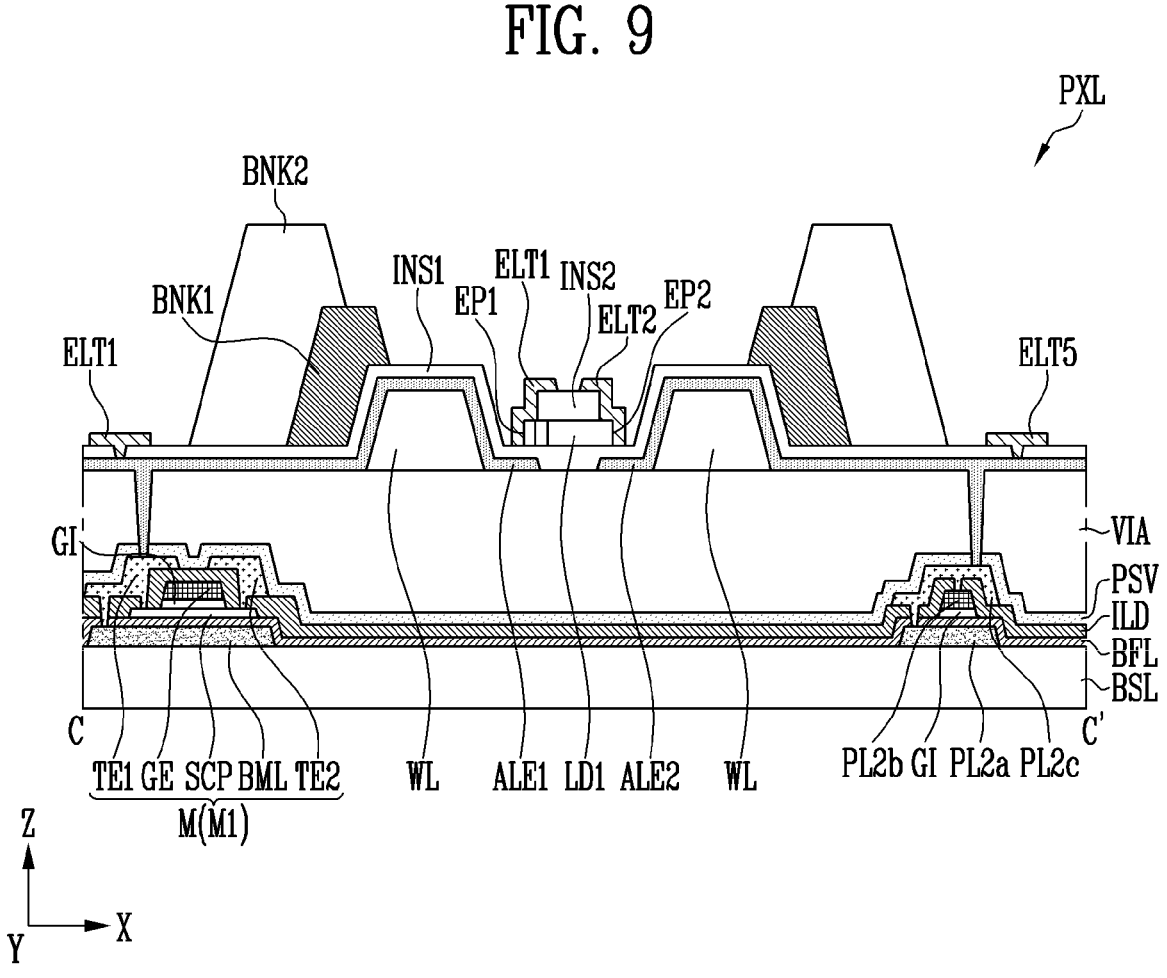
FIG. 9 is a schematic cross-sectional view taken along line C-C' shown in FIG. 6.
Figure 10:
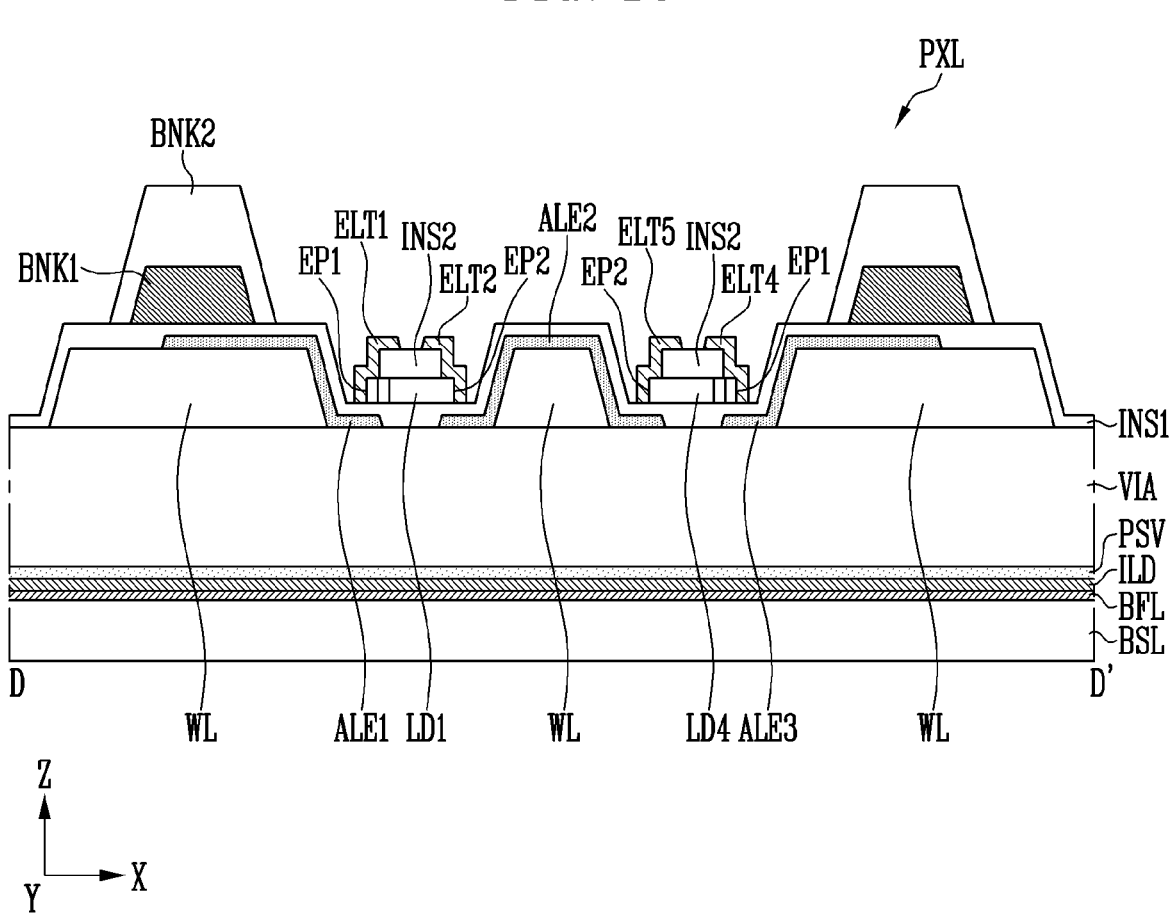
FIG. 10 is a schematic cross-sectional view taken along line D-D' shown in FIG. 6.

FIGS. 5 and 6 are schematic plan views illustrating a pixel in accordance with an embodiment of the disclosure. FIG. 7 is a schematic cross-sectional view taken along line A-A' shown in FIG. 5. FIG. 8 is a schematic cross-sectional view taken along line B-B' shown in FIG. 5. FIG. 9 is a schematic cross-sectional view taken along line C-C' shown in FIG. 6. FIG. 10 is a schematic cross-sectional view taken along line D-D' shown in FIG. 6.

In an embodiment, FIGS. 5 and 6 illustrate that the pixel PXL is one of the first to third pixels PXL1, PXL2, and PXL3 constituting the pixel unit (see, e.g., PXU of FIG. 3), and the first to third pixels PXL1, PXL2, and PXL3 have structures substantially identical or similar to one another. Although FIGS. 5 and 6 illustrate that each pixel PXL includes light emitting elements LD disposed in four serial stages (see, e.g., FIG. 4), the number of serial stages of each pixel PXL may be variously changed in another embodiment.

Hereinafter, in case that at least one of the first to fourth light emitting elements LD1, LD2, LD3, and LD4 is arbitrarily designated or in case that at least two of the first to fourth light emitting elements LD1, LD2, LD3, and LD4 are inclusively designated, the corresponding light emitting element or the corresponding light emitting elements will be referred to as a "light emitting element LD" or "light emitting elements LD." In case that at least one of first to third electrodes ALE1, ALE2, and ALE3 is arbitrarily designated or in case that at least two of the first to third electrodes ALE1, ALE2, and ALE3 are inclusively designated, the corresponding electrode or the corresponding electrodes will be referred to as an "electrode ALE" or "electrodes ALE." In case that at least one of the first to fifth connection electrodes ELT1, ELT2, ELT3, ELT4, and ELT5 is arbitrarily designated or in case that at least two or more kinds of the first to fifth connection electrodes ELT1, ELT2, ELT3, ELT4, and ELT5 are inclusively designated, the corresponding connection electrode or the corresponding connection electrodes will be referred to as a "connection electrode ELT" or "connection electrodes ELT."

Referring to FIGS. 5 and 6, each pixel PXL may include an emission area EA and a non-emission area NEA. The emission area EA may be an area including light emitting elements LD and may emit light. The non-emission area NEA may be disposed adjacent to the emission area EA. The non-emission area NEA may be an area in which a first bank BNK1 surrounding the emission area EA is disposed. The first bank BNK1 may be disposed in the non-emission area NEA and surround (e.g., at least partially surround) at least a portion of the emission area EA.

The first bank BNK1 may include an opening overlapping the emission area EA in a plan view. The opening of the first bank BNK1 may provide a space in which light emitting elements LD can be provided in a process of supplying the light emitting elements LD to each pixel PXL. For example, a kind (e.g., a desired or selectable kind) and/or an amount (e.g., a desired or selectable amount) of light emitting element ink may be supplied to the space partitioned by the opening of the first bank BNK1.

In an embodiment, the first bank BNK1 may include an organic material such as an acrylic resin, an epoxy resin, a phenolic resin, a polyamide resin, a polyimide resin, an unsaturated polyester resin, a poly-phenylene ether resin, a poly-phenylene sulfide resin, benzocyclobutene (BCB), the like, or a combination thereof. However, the disclosure is not necessarily limited thereto, and in another embodiment, the first bank BNK1 may include various an inorganic insulating material such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), the like, or a combination thereof.

In an embodiment, the first bank BNK1 may include at least one light blocking material and/or at least one reflective material. Accordingly, light leakage between adjacent pixels PXL may be prevented. For example, the first bank BNK1 may include at least one black pigment.

Each pixel PXL may include partition walls WL, electrodes ALE, light emitting elements LD, and/or connection electrodes ELT.

The partition walls WL may overlap the emission area EA in a plan view and be spaced apart from each other. The partition walls WL may be at least partially disposed in the non-emission area NEA. The partition walls WL may extend in a second direction (Y-axis direction), and be spaced apart from each other in the first direction (X-axis direction).

Each of the partition walls WL may overlap (e.g., partially overlap) at least one electrode ALE in at least the emission area EA in a plan view. For example, the partition walls WL may be disposed on the bottom of (or below) the electrodes ALE. As the partition wall WL is disposed on the bottom of (or below) an area of each of the electrodes ALE, the area of each of the electrodes ALE may protrude in an upper direction, i.e., a third direction (Z-axis direction) in an area in which the partition wall WL is formed. In case that the partition walls WL and/or the electrodes ALE include a reflective material, a reflective wall structure may be formed at a periphery of the light emitting elements LD. Accordingly, light emitted from the light emitting elements LD may be emitted in the upper direction of the pixel PXL (e.g., a front direction of the display panel PNL, including a viewing angle range (e.g., a predetermined or selectable viewing angle range)), and light emission efficiency of the display panel PNL may be improved.

The electrodes ALE may be disposed in at least the emission area EA. The electrode ALE may extend in the second direction (Y-axis direction), and be spaced apart from each other in the first direction (X-axis direction).

Each of first to third electrodes ALE1, ALE2, and ALE3 may extend in the second direction (Y-axis direction), and the first to third electrodes ALE1, ALE2, and ALE3 may be spaced apart from each other in the first direction (X-axis direction) and may be sequentially disposed. Some of the electrodes ALE may be electrically connected to the pixel circuit (see, e.g., PXC of FIG. 4) and/or a power line (e.g., a predetermined or selectable power line) through contact holes. For example, the first electrode ALE1 may be electrically connected to the pixel circuit PXC and/or the first power line PL1 through a contact hole, and the third electrode ALE3 may be electrically connected to the second power line PL2 through a contact hole.

In an embodiment, some of the electrodes ALE may be electrically connected to some of the connection electrodes ELT through contact holes. For example, the first electrode ALE1 may be electrically connected to a first connection electrode ELT1 through a contact hole, and the second electrode ALE2 may be electrically connected to a fifth connection electrode ELT5 through a contact hole.

A pair of electrodes ALE disposed adjacent to each other may be supplied with different signals in a process of aligning the light emitting elements LD. For example, in case that the first to third electrodes ALE1, ALE2, and ALE3 are arranged (e.g., sequentially arranged) in the first direction (X-axis direction), the first and second electrodes ALE and ALE2 may be supplied with different alignment signals, and the second and third electrodes ALE2 and ALE3 may be supplied with different alignment signals.

Each of the light emitting elements LD may be aligned between a pair of electrodes ALE in the emission area EA. Each of the light emitting elements LD may be electrically connected between a pair of connection electrodes ELT.

A first light emitting element LD1 may be aligned between the first electrode ALE1 and the second electrode ALE2. The first light emitting element LD1 may be electrically connected between the first and second connection electrodes ELT1 and ELT2. In an embodiment, the first light emitting element LD1 may be aligned in a first area (e.g., an upper end area) of the first and second electrodes ALE1 and ALE2. A first end portion EP1 of the first light emitting element LD1 may be electrically connected to the first connection electrode ELT1, and a second end portion EP2 of the first light emitting element LD1 may be electrically connected to the second connection electrode ELT2.

A second light emitting element LD2 may be aligned between the first and second electrodes ALE1 and ALE2. The second light emitting element LD2 may be electrically connected between the second connection electrode ELT2 and a third connection electrode ELT3. In an embodiment, the second light emitting element LD2 may be aligned in a second area (e.g., a lower end area) of the first and second electrodes ALE1 and ALE2. A first end portion EP1 of the second light emitting element LD2 may be electrically connected to the second connection electrode ELT2, and a second end portion EP2 of the second light emitting element LD2 may be electrically connected to the third connection electrode ELT3.

A third light emitting element LD3 may be aligned between the second and third electrodes ALE2 and ALE3. The third light emitting element LD3 may be electrically connected between the third connection electrode ELT3 and a fourth connection electrode ELT4. In an embodiment, the third light emitting element LD3 may be aligned in a second area (e.g., a lower end area) of the second and third electrodes ALE2 and ALE3. A first end portion EP1 of the third light emitting element LD3 may be electrically connected to the third connection electrode ELT3, and a second end portion EP2 of the third light emitting element LD3 may be electrically connected to the fourth connection electrode ELT4.

A fourth light emitting element LD4 may be aligned between the second and third electrodes ALE2 and ALE3. The fourth light emitting element LD4 may be electrically connected between the fourth connection electrode ELT4 and the fifth connection electrode ELT5. In an embodiment, the fourth light emitting element LD4 may be aligned in a first area (e.g., an upper end area) of the second and third electrodes ALE2 and ALE3. A first end portion EP1 of the fourth light emitting element LD4 may be electrically connected to the fourth connection electrode ELT4, and a second end portion EP2 of the fourth light emitting element LD4 may be electrically connected to the fifth connection electrode ELT5.

In an embodiment, the first light emitting element LD1 may be located at a left upper end area of the emission area EA, and the second light emitting element LD2 may be located at a left lower end area of the emission area EA. The third light emitting elements LD3 may be located at a right lower end area of the emission area EA, and the fourth light emitting element LD4 may be located at a right upper end area of the emission area EA. However, the arrangement and/or connection structure of the light emitting elements LD are not limited to thereto, in another embodiment, and the arrangement and/or connection structure of the light emitting elements LD may be variously changed according to the structure of the light emitting part EMU and/or the number of serial stages.

Each of the connection electrodes ELT may be disposed in at least the emission area EA, and overlap at least one electrode ALE and/or at least one light emitting element LD in a plan view. For example, each of the connection electrodes ELT may be formed on the electrodes ALE and/or the light emitting elements LD to overlap the electrodes ALE and/or the light emitting elements LD in a plan view. Therefore, each of the electrodes ELT may be electrically connected to the light emitting elements LD.

The first connection electrode ELT1 may be disposed on a first portion (e.g., an upper end portion) of the first electrode ALE1 and the first end portions EP1 of the first light emitting elements LD1, and may be electrically connected to the first end portions EP1 of the first light emitting elements LD1.

The second connection electrode ELT2 may be disposed on a first portion (e.g., an upper end portion) of the second electrode ALE2 and the second end portions EP2 of the first light emitting elements LD1, and may be electrically connected to the second end portions EP2 of the first light emitting elements LD1. Also, the second connection electrode ELT2 may be disposed on a second portion (e.g., a lower end portion) of the first electrode ALE and the first end portions EP1 of the second light emitting elements LD2, and may be electrically connected to the first end portions EP1 of the second light emitting elements LD2. For example, the second connection electrode ELT2 may electrically connect the second end portions EP2 of the first light emitting elements LD1 and the first end portions EP1 of the second light emitting elements LD2 to each other in the emission area EA. For example, the second connection electrode ELT2 may have a bent shape. For example, the second connection electrode ELT2 may have a structure bent or curved at a boundary between an area in which at least one first light emitting element LD1 is arranged and an area in which at least one second light emitting element LD2 is arranged.

The third connection electrode ELT3 may be disposed on a second portion (e.g., a lower end portion) of the second electrode ALE2 and the second end portions EP2 of the second light emitting elements LD2, and may be electrically connected to the second end portions EP2 of the second light emitting elements LD2. Also, the third connection electrode ELT3 may be disposed on a second portion (e.g., a lower end portion) of the third electrode ALE3 and the first end portions EP1 of the third light emitting elements LD3, and may be electrically connected to the first end portions EP1 of the third light emitting elements LD3. For example, the third connection electrode ELT3 may electrically connect the second end portions EP2 of the second light emitting elements LD2 and the first end portions EP1 of the third light emitting elements LD3 to each other in the emission area EA. For example, the third connection electrode ELT3 may have a bent shape. For example, the third connection electrode ELT3 may have a structure bent or curved at a boundary between an area in which at least one second light emitting element LD2 is arranged and an area in which at least one third light emitting element LD3 is arranged.

The fourth connection electrode ELT4 may be disposed on the second portion (e.g., the lower end portion) of the second electrode ALE2 and the second end portions EP2 of the third light emitting elements LD3, and may be electrically connected to the second end portions EP2 of the third light emitting elements LD3. Also, the fourth connection electrode ELT4 may be disposed on a first portion (e.g., an upper end portion) of the third electrode ALE3 and the first end portions EP1 of the fourth light emitting elements LD4, and may be electrically connected to the first end portions EP1 of the fourth light emitting elements LD4. For example, the fourth connection electrode ELT4 may electrically connect the second end portions EP2 of the third light emitting elements LD3 and the first end portions EP1 of the fourth light emitting elements LD4 to each other in the emission area EA. For example, the fourth connection electrode ELT4 may have a bent shape. For example, the fourth connection electrode ELT4 may have a structure bent or curved at a boundary between an area in which at least one third light emitting element LD3 is arranged and an area in which at least one fourth light emitting element LD4 is arranged.

The fifth connection electrode ELT5 may be disposed on the first portion (e.g., the upper end portion) of the second electrode ALE2 and the second end portions EP2 of the fourth light emitting elements LD4, and may be electrically connected to the second end portions EP2 of the fourth light emitting elements LD4.

The first connection electrode ELT1, the third connection electrode ELT3, and/or the fifth connection electrode ELT5 may be disposed (or included) in a same conductive layer. The second connection electrode ELT2 and the fourth connection electrode ELT4 may be disposed (or included) in a same conductive layer. In an embodiment, the connection electrodes ELT may be disposed (or included) in multiple conductive layers (see, e.g., FIG. 9). For example, the first connection electrode ELT1, the third connection electrode ELT3, and/or the fifth connection electrode ELT5 may be disposed (or included) in a first conductive layer, and the second connection electrode ELT2 and the fourth connection electrode ELT4 may be disposed (or included) in a second conductive layer. The second conductive layer and the first conductive layer may be different from each other. In another embodiment, the first to fifth connection electrodes ELT1, ELT2, ELT3, ELT4, and ELT5 may be disposed (or included in) a same conductive layer (see. e.g., FIG. 10).

In the above-described embodiment, the light emitting elements LD aligned between the electrodes ALE may be electrically connected in a form (e.g., a desired or selectable form) by using the connection electrodes ELT. For example, the first light emitting elements LD1, the second light emitting elements LD2, the third light emitting elements LD3, and the fourth light emitting elements LD4 may be sequentially connected in series by using the connection electrodes ELT.

Hereinafter, a cross-sectional structure of the pixel PXL will be schematically described in detail with reference to FIGS. 7 to 10. The first transistor M1 among various circuit elements constituting the pixel circuit (see, e.g., PXC of FIG. 4) is illustrated in FIGS. 7 and 10. In case that the first to third transistors M1, M2, and M3 are designated without being distinguished from each other, each of the first to third transistors M1, M2, and M3 will be inclusively referred to as a "transistor M." However, the structure of transistors M and/or the positions of the transistors M for each layer is not limited to the embodiment shown in FIGS. 7 and 10, and may be variously changed in another embodiment.

Each pixel PXL in accordance with an embodiment of the disclosure may include circuit elements including transistors M disposed on a base layer BSL and various lines connected to the circuit elements. Electrodes ALE, light emitting elements LD, connection electrodes ELT, a first bank BNK1, and/or a second bank BNK2, which constitute a light emitting part EMU, may be disposed on the circuit elements.

The base layer BSL may constitute a base member, and may be a rigid or flexible substrate, a film, or the like. In an embodiment, the base layer BSL may be a rigid substrate including glass or tempered glass, a flexible substrate (or thin film) including a plastic or metal material, or at least one insulating layer. However, the material and/or property of the base layer BSL is not particularly limited thereto. In an embodiment, the base layer BSL may be substantially transparent. The term "substantially transparent" may mean that light can be transmitted with greater than or equal to a predetermined or selectable transmittance. In another embodiment, the base layer BSL may be translucent or opaque. Also, the base layer BSL may include a reflective material in an embodiment.

A lower conductive layer BML and a first power conductive layer PL2a may be disposed on the base layer BSL. The lower conductive layer BML and the first power conductive layer PL2a may be disposed in a same layer. For example, the lower conductive layer BML and the first power conductive layer PL2a may be simultaneously formed by a same process, but the disclosure is not necessarily limited thereto. The first power conductive layer PL2a may constitute the second power line (see, e.g., PL2 of FIG. 4 and the like).

Each of the lower conductive layer BML and the first power conductive layer PL2a may have a single layer or multi-layers. The each of the lower conductive layer BML and the first power conductive layer PL2a may include molybdenum (Mo), copper (Cu), aluminum (Al), chromium (Cr), gold (Au), titanium (Ti), nickel (Ni), neodymium (Nd), indium (In), tin (Sn), the like, an oxide, or an alloy thereof.

A buffer layer BFL may be disposed on the lower conductive layer BML and the first power conductive layer PL2a. The buffer layer BFL may prevent an impurity from being diffused into each circuit element. In an embodiment, the buffer layer BFL may have a single layer, but the disclosure is not limited thereto. In another embodiment, the buffer layer BFL may have multi-layers including at least two layers. In case that the buffer layer BFL has multi-layers, the layers may be formed of a same material or different materials.

A semiconductor pattern SCP may be disposed on the buffer layer BFL. In an embodiment, the semiconductor pattern SCP may include a first region contacting a first transistor electrode TE1, a second region contacting a second transistor electrode ET2, and a channel region interposed between the first region and the second region. In an embodiment, one of the first and second regions may be a source region, and another one of the first and second regions may be a drain region.

In an embodiment, the semiconductor pattern SCP may include polysilicon, amorphous silicon, oxide semiconductor, or the like. The channel region of the semiconductor pattern SCP may be a semiconductor pattern undoped with an impurity, and may be an intrinsic semiconductor. Each of the first and second regions of the semiconductor pattern SCP may be a semiconductor pattern doped with an impurity (e.g., a predetermined or selectable impurity).

A gate insulating layer GI may be disposed on the buffer layer BFL and the semiconductor pattern SCP. In an embodiment, the gate insulating layer GI may be disposed between the semiconductor pattern SCP and a gate electrode GE. The gate insulating layer GI may be disposed between the buffer layer BFL and a second power conductive layer PL2b. The gate insulating layer GI may have a single layer or multi-layers, and may include an inorganic insulating material such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), the like, or a combination thereof.

The gate electrode GE of the transistor M and the second power conductive layer PL2b may be disposed on the gate insulating layer GI. For example, the gate electrode GE and the second power conductive layer PL2b may be disposed in a same layer. For example, the gate electrode GE and the second power conductive layer PL2b may be simultaneously formed by a same process, but the disclosure is not necessarily limited thereto. The gate electrode GE may be disposed on the gate insulating layer GI and overlap the semiconductor pattern SCP in the third direction (Z-axis direction). The second power conductive layer PL2b may be disposed on the gate insulating layer GI and overlap the first power conductive layer PL2a in the third direction (Z-axis direction). The second power conductive layer PL2b along with the first power conductive layer PL2a may constitute the second power line (see, e.g., PL2 of FIG. 4 and the like).

Each of the gate electrode GE and the second power conductive layer PL2b may have a single layer or multi-layers. The each of the gate electrode GE and the second power conductive layer PL2b may include molybdenum (Mo), copper (Cu), aluminum (Al), chromium (Cr), gold (Au), titanium (Ti), nickel (Ni), neodymium (Nd), indium (In), tin (Sn), the like, an oxide or, an alloy thereof. For example, each of the gate electrode GE and the second power conductive layer PL2$b$ may have multi-layers in which titanium (Ti), copper (Cu), and/or indium tin oxide (ITO) are sequentially or repeatedly stacked.

An interlayer insulating layer ILD may be disposed on the gate electrode GE and the second power conductive layer PL2$b$. In an embodiment, the interlayer insulating layer ILD may be disposed between the gate electrode GE and the first and second transistor electrodes TE1 and TE2. The interlayer insulating layer ILD may be disposed between the second power conductive layer PL2$b$ and a third power conductive layer PL2$c$.

The interlayer insulating layer ILD may have a single layer or multi-layers, and may include an inorganic insulating material such as silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), titanium oxide (TiO$_x$), the like, or a combination thereof.

The first and second transistor electrodes TE1 and TE2 of the transistor M and the third power conductive layer PL2$c$ may be disposed on the interlayer insulating layer ILD. The first and second transistor electrodes TE1 and TE2 and the third power conductive layer PL2$c$ may be disposed in a same layer. For example, the first and second transistor electrodes TE1 and TE2 and the third power conductive layer PL2$c$ may be simultaneously formed by a same process, but the disclosure is not necessarily limited thereto.

The first and second transistor electrodes TE1 and TE2 may overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole penetrating the interlayer insulating layer ILD. The first transistor electrode TE1 may be electrically connected to the lower conductive layer BML through a contact hole penetrating the interlayer insulating layer ILD and the buffer layer BFL. The second transistor electrode TE2 may be electrically connected to the second region of the semiconductor pattern SCP through a contact hole penetrating the interlayer insulating layer ILD. In an embodiment, one of the first and second transistor electrodes TE1 and TE2 may be a source electrode, and another one of the first and second transistor electrodes TE1 and TE2 may be a drain electrode.

The third power conductive layer PL2$c$ may overlap the first power conductive layer PL2$a$ and/or the second power conductive layer PL2$b$ in the third direction (Z-axis direction). The third power conductive layer PL2$c$ may be electrically connected to the first power conductive layer PL2$a$ and/or the second power conductive layer PL2$b$. For example, the third power conductive layer PL2$c$ may be electrically connected to the first power conductive layer PL2$a$ through a contact hole penetrating the interlayer insulating layer ILD and the buffer layer BFL. The third power conductive layer PL2$c$ may be electrically connected to the second power conductive layer PL2$b$ through a contact hole penetrating the interlayer insulating layer ILD. The third power conductive layer PL2$c$ along with the first power conductive layer PL2$a$ and/or the second power conductive layer PL2$b$ may constitute the second power line (see, e.g., PL2 of FIG. 4 and the like).

The first and second transistor electrodes TEL and TE2 and the third power conductive layer PL2$c$ may have a single layer or multi-layers. The first and second transistor electrode TE1 and TE2 and the third power conductive layer PL2$c$ may include molybdenum (Mo), copper (Cu), aluminum (Al), chromium (Cr), gold (Au), titanium (Ti), nickel (Ni), neodymium (Nd), indium (In), tin (Sn), the like, an oxide, or an alloy thereof.

A protective layer PSV may be disposed on the first and second transistor electrodes TE1 and TE2 and the third power conductive layer PL2$c$. The protective layer PSV may have a single layer or multi-layers, and may include an inorganic insulating material such as silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), titanium oxide (TiO$_x$), the like, or a combination thereof.

A via layer VIA may be disposed on the protective layer PSV. The via layer VIA may include an organic material and may planarize a lower step difference. For example, the via layer VIA may include an organic material such as an acrylic resin, an epoxy resin, a phenolic resin, a polyamide resin, a polyimide resin, an unsaturated polyester resin, a poly-phenylene ether resin, a poly-phenylene sulfide resin, benzocyclobutene (BCB), the like, or a combination thereof. However, the disclosure is not necessarily limited thereto, and in another embodiment, the via layer VIA may include an inorganic insulating material such as silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), titanium oxide (TiO$_x$), the like, or a combination thereof.

Partition walls WL may be disposed on the via layer VIA. The partition walls WL may form a step difference such that the light emitting elements LD can be readily aligned in the emission area EA.

In an embodiment, the partition walls WL may have various shapes. In an embodiment, the partition walls WL may have a shape protruding in the third direction (Z-axis direction) on the base layer BSL. In an embodiment, the partition walls WL may have an inclined surface inclined at an angle (e.g., a predetermined or selectable angle) with respect to the base layer BSL. However, the disclosure is not necessarily limited thereto, and in another embodiment, the partition walls WL may have a sidewall having a curved shape, a stepped shape, or the like. In another embodiment, the partition walls WL may have a section having a semi-circular shape, a semi-elliptical shape, or the like.

The partition walls WL may include at least one organic material and/or at least one inorganic material. In an embodiment, the partition walls WL may include an organic material such as an acrylic resin, an epoxy resin, phenolic resin, a polyamide resin, a polyimide resin, an unsaturated polyester resin, a poly-phenylene ether resin, a poly-phenylene sulfide resin, benzocyclobutene (BCB), the like, or a combination thereof. However, the disclosure is not necessarily limited thereto, and in another embodiment, the partition walls WL may include an inorganic insulating material such as silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), titanium oxide (TiO$_x$), the like, or a combination thereof.

Electrodes ALE may be disposed on the via layer VIA and the partition walls WL. The electrodes ALE may at least partially cover side surfaces and/or top surfaces of the partition walls WL. The electrodes ALE disposed on the top of the partition walls WL may have a shape corresponding to the partition wall WL. In an embodiment, the electrodes ALE disposed on the partition walls WL may include an inclined surface or a curved surface, which has a shape corresponding to the shape of the partition walls WL. The partition walls WL and the electrodes ALE may serve as a reflective member, may reflect light emitted from the light emitting elements LD, and may guide the reflected light in a front direction of the pixel PXL, i.e., the third direction (Z-axis direction). Thus, the light emission efficiency of the display panel PNL may be improved.

The electrodes ALE may be spaced apart from each other. The electrodes ALE may be disposed in the same layer. For example, the electrodes ALE may be simultaneously formed by a same process, but the disclosure is not necessarily limited thereto.

The electrodes ALE may be supplied with an alignment signal in a process of aligning the light emitting elements LD. Accordingly, an electric field may be formed between the electrodes ALE, and the light emitting elements LD disposed in each pixel PXL may be aligned between the electrodes ALE.

The electrodes ALE may include at least one conductive material. In an embodiment, the electrodes ALE may include at least one metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), the like, or an alloy thereof, at least one conductive oxide such as Indium Tin Oxide (ITO), Indium Zinc Oxide (IZO), Indium Tin Zinc Oxide (ITZO), Aluminum doped Zinc Oxide (AZO), Gallium doped Zinc Oxide (GZO), Zinc Tin Oxide (ZTO), and Gallium Tin Oxide (GTO), and at least one conductive material of conductive polymers such as PEDOT or the like. However, the disclosure is not necessarily limited thereto.

A first electrode ALE1 may be electrically connected to the first transistor electrode TE1 of the transistor M through a contact hole penetrating the via layer VIA and the protective layer PSV. A second electrode ALE2 may be electrically connected to the third power conductive layer PL2$c$ through a contact hole penetrating the via layer VIA and the protective layer PSV.

A first insulating layer INS1 may be disposed on the electrodes ALE. The first insulating layer INS1 may have a single layer or multi-layers, and may include an inorganic insulating material such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), the like, or a combination thereof.

A first bank BNK1 may be disposed on the first insulating layer INS1. The first bank BNK1 may include an opening overlapping the emission area EA in the third direction (Z-axis direction). The opening of the first bank BNK1 may provide a space in which light emitting elements LD can be provided in a process of supplying the light emitting elements LD to each of the pixels PXL. For example, a kind (e.g., a desired or selectable kind) and/or an amount (e.g., a desired or selectable amount) of light emitting element ink may be supplied to the space partitioned by the opening of the first bank BNK1.

The first bank BNK1 may include an organic material such as an acrylic resin, an epoxy resin, a phenolic resin, a polyamide resin, a polyimide resin, an unsaturated polyester resin, a poly-phenylene ether resin, a poly-phenylene sulfide resin, benzocyclobutene (BCB), the like, or a combination thereof. However, the disclosure is not necessarily limited thereto, and the first bank BNK1 may include an inorganic insulating material such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), the like, or a combination thereof.

Light emitting elements LD may be disposed between the electrodes ALE. The light emitting elements LD may be biased and aligned between the electrodes ALE. In an embodiment, the light emitting element LD may be biased and aligned such that first end portions EP1 (or first semiconductor layers 11) overlap the first electrode ALE1 in the third direction (Z-axis direction) and second end portions EP2 (or second semiconductor layers 13) overlap the second electrode ALE2 in the third direction (Z-axis direction).

The light emitting elements LD may be disposed in the opening of the first bank BNK1 between the partition walls WL. The light emitting elements LD may be prepared in a form in which the light emitting elements LD are dispersed in a light emitting element ink, and may be supplied to each of the pixels PXL through an inkjet printing process, or the like. In an embodiment, the light emitting elements LD may be dispersed in a volatile solvent and may be provided to each pixel PXL. In case that an alignment signal is supplied through the electrodes ALE, the light emitting elements LD may be aligned between the electrodes ALE, while an electric field is formed between the electrodes ALE. After the light emitting elements LD are aligned, the solvent may be volatilized or removed through other processes, and the light emitting elements LD may be stably arranged between the electrodes ALE.

A second insulating layer INS2 may be disposed on the light emitting elements LD. For example, the second insulating layer INS2 may be disposed (e.g., partially disposed) on the light emitting elements LD, and expose the first and second end portions EP1 and EP2 of the light emitting elements LD. In case that the second insulating layer INS2 is formed on the light emitting elements LD after the aligning of the light emitting elements LD, the light emitting elements LD may be prevented from being separated from positions at which the light emitting elements LD are aligned.

The second insulating layer INS2 may have a single layer or multi-layers, and may include an inorganic insulating material such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), the like, or a combination thereof.

The connection electrodes ELT may be disposed on the first and second end portions EP1 and EP2 of the light emitting elements LD, which are exposed by the second insulating layer INS2. A first connection electrode ELT1 may be disposed (e.g., directly disposed) on first end portions EP1 of first light emitting elements LD1, and may contact the first end portions EP1 (or first semiconductor layers 11) of the first light emitting elements LD1.

A second connection electrode ELT2 may be disposed (e.g., directly disposed) on second end portions EP2 (or second semiconductor layers 13) of the first light emitting elements LD1, and may contact the second end portions EP2 (or second semiconductor layers 13) of the first light emitting elements LD1. The second connection electrode ELT2 may be disposed (e.g., directly disposed) on first end portions EP1 (or first semiconductor layers 11) of second light emitting elements LD2, and may contact the first end portions EP1 (or first semiconductor layers 11) of the second light emitting elements LD2. For example, the second connection electrode ELT2 may electrically connect the second end portions EP2 (or second semiconductor layers 13) of the first light emitting elements LD1 and the first end portions EP1 (or first semiconductor layers 11) of the second light emitting elements LD2 to each other.

Similarly, a third connection electrode ELT3 may be disposed (e.g., directly disposed) on second end portions EP2 (or second semiconductor layers 13) of the second light emitting elements LD2, and may contact the second end portions EP2 (or second semiconductor layers 13) of the second light emitting elements LD2. The third connection electrode ELT3 may be disposed (e.g., directly disposed) on first end portions EP1 (or first semiconductor layers 11) of third light emitting elements LD3, and may contact the first end portions EP1 (or first semiconductor layers 11) of the third light emitting elements LD3. For example, the third connection electrode ELT3 may electrically connect the second end portions EP2 (or second semiconductor layers 13) of the second light emitting elements LD2 and the first end portions EP1 (or first semiconductor layers 11) of the third light emitting elements LD3 to each other.

Similarly, a fourth connection electrode ELT4 may be disposed (e.g., directly disposed) on second end portions EP2 (or second semiconductor layers 13) of the third light emitting elements LD3, and may contact the second end portions EP2 (or second semiconductor layers 13) of the third light emitting elements LD3. The fourth connection electrode ELT4 may be disposed (e.g., directly disposed) on first end portions EP1 (or first semiconductor layers 11) of fourth light emitting elements LD4, and may contact the first end portions EP1 (or first semiconductor layers 11) of the fourth light emitting elements LD4. For example, the fourth connection electrode ELT4 may electrically connect the second end portions EP2 (or second semiconductor layers 13) of the third light emitting elements LD3 and the first end portions EP1 (or first semiconductor layers 11) of the fourth light emitting elements LD4 to each other.

Similarly, a fifth connection electrode ELT5 may be disposed (e.g., directly disposed) on second end portions EP2 (or second semiconductor layers 13) of the fourth light emitting elements LD4, and may contact the second end portions EP2 (or second semiconductor layers 13) of the fourth light emitting elements LD4.

The first connection electrode ELT1 may be electrically connected to the first electrode ALE through a contact hole penetrating the first insulating layer INS1. The fifth connection electrode ELT5 may be electrically connected to the second electrode ALE2 through a contact hole penetrating the first insulating layer INS1.

In an embodiment, the connection electrodes ELT may be configured with multiple conductive layers. For example, the first, third, and fifth connection electrodes ELT1, ELT3, and ELT5 may be disposed in a same layer (see, e.g., FIGS. 7 and 8). The second and fourth connection electrodes ELT2 and ELT4 may be disposed in a same layer. The first connection electrode ELT1, the third connection electrode ELT3, and the fifth connection electrode ELT5 may be disposed on the second insulating layer INS2. A third insulating layer INS3 may be disposed on the first connection electrode ELT1, the third connection electrode ELT3, and the fifth connection electrode ELT5. The second connection electrode ELT2 and the fourth connection electrode ELT4 may be disposed on the third insulating layer INS3.

As such, in case that the third insulating layer INS3 is disposed between the connection electrodes ELT configured as different conductive layers, the connection electrodes ELT may be stably separated from each other by the third insulating layer INS3, and an electrical stability between the first end portion EP1 and the second end portion EP2 of the light emitting elements LD may be ensured.

The third insulating layer INS3 may have a single layer or multi-layers, and may include an inorganic insulating material such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), the like, or a combination thereof.

In another embodiment, the connection electrodes ELT may be configured with a same conductive layer. For example, the first to fifth connection electrodes ELT1, ELT2, ELT3, ELT4, and ELT5 may be disposed in a same layer (see, e.g., FIGS. 9 and 10). In an embodiment, the first to fifth connection electrodes ELT1, ELT2, ELT3, ELT4, and ELT5 may be simultaneously formed by a same process. As such, when the connection electrodes ELT are simultaneously formed, the number of masks may be decreased, and a manufacturing process may be simplified.

The connection electrodes ELT may include a transparent conductive material. In an embodiment, the connection electrodes ELT may include at least one transparent conductive material such as Indium Tin Oxide (ITO), Indium Zinc Oxide (IZO), Indium Tin Zinc Oxide (ITZO), Aluminum doped Zinc Oxide (AZO), Gallium doped Zinc Oxide (GZO), Zinc Tin Oxide (ZTO), Gallium Tin Oxide (GTO), the like, or a combination thereof, and may be implemented substantially transparently or translucently and satisfy a transmittance (e.g., a predetermined or selectable transmittance). Accordingly, light emitted from the first and second end portions EP1 and EP2 of the light emitting elements LD may be emitted to an outside of the display panel PNL while passing through the connection electrodes ELT.

A second bank BNK2 may be disposed on the first bank BNK1. The second bank BNK2 may be disposed in the non-emission area NEA.

The second bank BNK2 may include an opening overlapping the emission area EA in the third direction (Z-axis direction). The opening of the second bank BNK2 may provide a space in which a color conversion layer which will be described above can be provided. For example, a kind (e.g., a desired or selectable kind) and/or an amount (e.g., a desired or selectable amount) of color conversion layer may be supplied to the space partitioned by the opening of the second bank BNK2.

The second bank BNK2 may include an organic material such as an acrylic resin, an epoxy resin, a phenolic resin, a polyamide resin, a polyimide resin, an unsaturated polyester resin, a poly-phenylene ether resin, a poly-phenylene sulfide resin, benzocyclobutene (BCB), the like, or a combination thereof. However, the disclosure is not necessarily limited thereto, and in another embodiment, the second bank BNK2 may include an inorganic insulating material such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), the like, or a combination thereof.

In an embodiment, the second bank BNK2 may include at least one light blocking material and/or at least one reflective material. Accordingly, light leakage between adjacent pixels PXL may be prevented. For example, the second bank BNK2 may include at least one black pigment.

Figure 11:
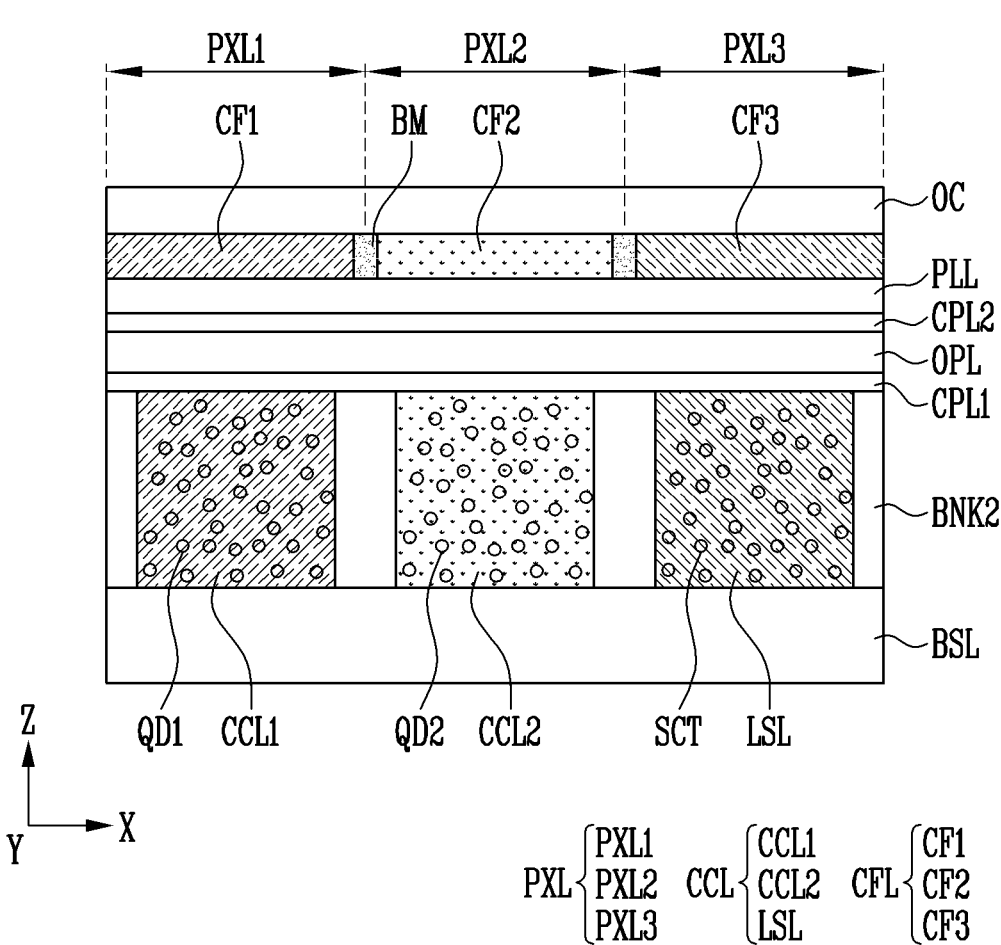
FIG. 11 is a schematic cross-sectional view illustrating first to third pixels in accordance with an embodiment of the disclosure.
Figure 12:
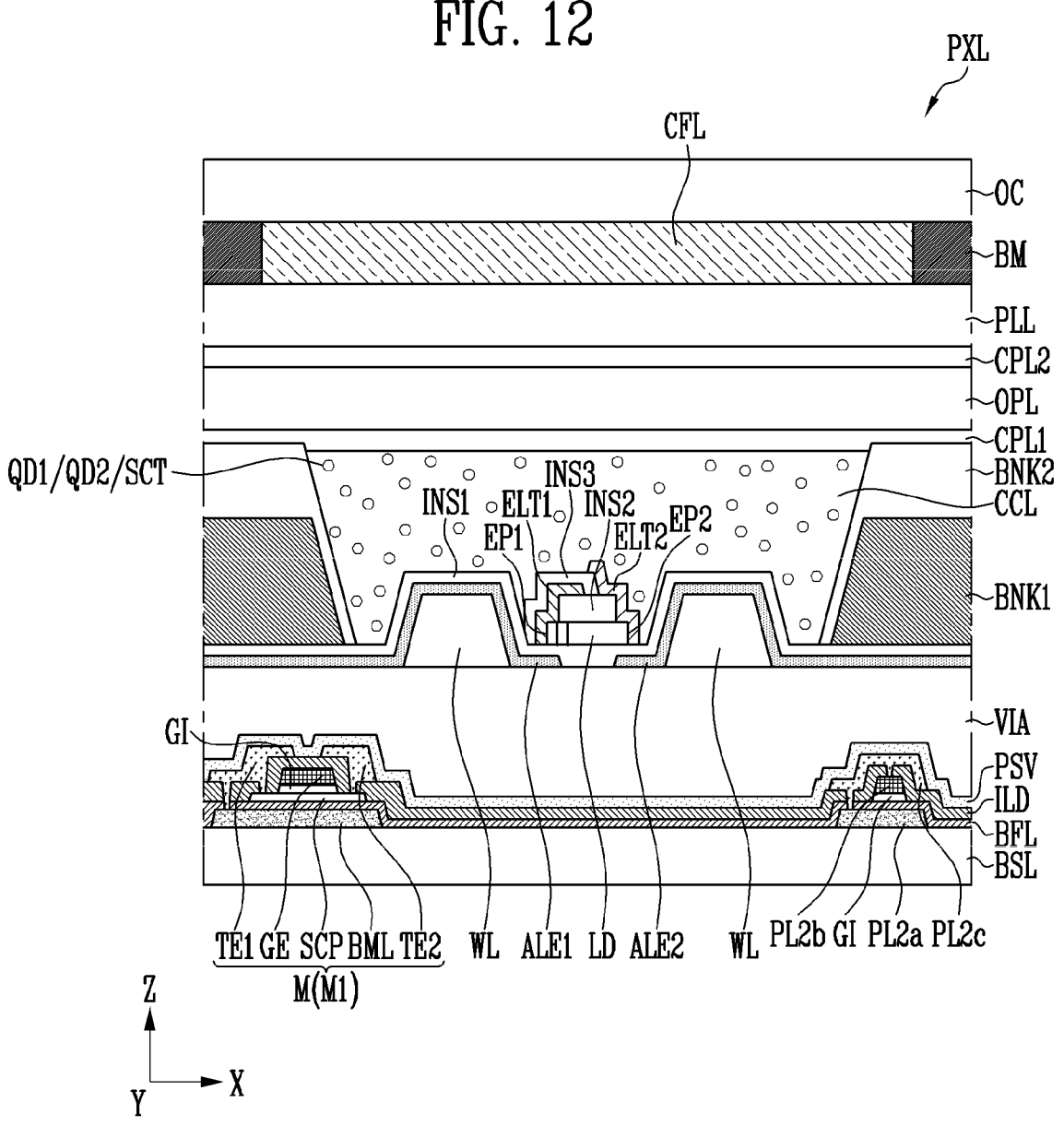
FIG. 12 is a schematic cross-sectional view illustrating a pixel in accordance with an embodiment of the disclosure.

FIG. 11 is a schematic cross-sectional view illustrating first to third pixels in accordance with an embodiment of the disclosure. FIG. 12 is a schematic cross-sectional view illustrating a pixel in accordance with an embodiment of the disclosure.

FIG. 11 illustrates a color conversion layer CCL, an optical layer OPL, and/or a color filter layer CFL. In FIG. 11, for convenience of description, the components except the base layer (see, e.g., BSL of FIGS. 7 to 10) and the second bank (see, e.g., BNK2 of FIGS. 7 to 10), will be omitted. FIG. 12 illustrates in detail a stacked structure of a pixel PXL in relation to the color conversion layer CCL, the optical layer OPL, and/or the color filter layer CFL.

Referring to FIGS. 11 and 12, the second bank BNK2 may be disposed between first pixel PXL1, second pixel PXL2, and third pixel PXL3 or at a boundary of the first to third pixels PXL1, PXL2, and PXL3, and may include an opening overlapping each of the first to third pixels PXL1, PXL2, and PXL3 in the third direction (Z-axis direction). The opening of the second bank BNK2 may provide a space in which the color conversion layer CCL can be provided.

The color conversion layer CCL may be disposed on light emitting elements LD in the opening of the second bank BNK2. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first to third pixels PXL1, PXL2, and PXL3 may include light emitting elements LD emitting light of a same color. For example, the first to third pixels PXL1, PXL2, and PXL3 may include light emitting elements LD emitting light of a third color (or blue). The color conversion layer CCL including color conversion particles may be disposed in each of the first to third pixels PXL1, PXL2, and PXL3, and a full-color image may be displayed.

The first color conversion layer CCL1 may include first color conversion particles for converting light of the third color, which is emitted from the light emitting element LD, into light of a first color. For example, the first color conversion layer CCL1 may include multiple first quantum dots QD1 dispersed in a matrix material (e.g., a predetermined or selectable matrix material) such as a base resin or the like.

In an embodiment, in case that the light emitting element LD is a blue light emitting element emitting light of blue, and the first pixel PXL1 is a red pixel, the first color conversion layer CCL1 may include a first quantum dot QD1 for converting light of blue, which is emitted from the blue light emitting element, into light of red. The first quantum dot QD1 may absorb blue light and emit red light by shifting a wavelength of the blue light according to energy transition. In case that the first pixel PXL1 is a pixel of another color, the first color conversion layer CCL1 may include a first quantum dot QD1 corresponding to the color of the first pixel PXL1.

The second color conversion layer CCL2 may include second color conversion particles for converting light of the third color, which is emitted from the light emitting element LD, into light of a second color. For example, the second color conversion layer CCL2 may include multiple second quantum dots QD2 dispersed in a matrix material (e.g., a predetermined or selectable matrix material) such as a base resin or the like.

In an embodiment, in case that the light emitting element LD is a blue light emitting element emitting light of blue, and the second pixel PXL2 is a green pixel, the second color conversion layer CCL2 may include a second quantum dot QD2 for converting light of blue, which is emitted from the blue light emitting element, into light of green. The second quantum dot QD2 may absorb blue light and emit green light by shifting a wavelength of the blue light according to energy transition. In case that the second pixel PXL2 is a pixel of another color, the second color conversion layer CCL2 may include a second quantum dot QD2 corresponding to the color of the second pixel PXL2.

In an embodiment, light of blue having a relatively short wavelength in a visible light band may be incident into the first quantum dot QD1 and the second quantum dot QD2, and absorption coefficients of the first quantum dot QD1 and the second quantum dot QD2 may be increased. Accordingly, an efficiency of light finally emitted from the first and second pixels PXL1 and PXL2 may be improved, and excellent color reproduction may be ensured. The light emitting part EMU of each of the first to third pixels PXL1, PXL2, and PXL3 may include light emitting elements LD of a same color (e.g., blue light emitting elements), and a manufacturing efficiency of the display device may be improved.

The light scattering layer LSL may be provided to efficiently use light of the third color (or blue) emitted from the light emitting element LD. In an embodiment, in case that the light emitting element LD is a blue light emitting element emitting light of blue, and the third pixel PXL3 is a blue pixel, the light scattering layer LSL may include at least one of light scattering particle SCT and may efficiently use light emitted from the light emitting element LD. In an embodiment, the light scattering particle SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The light scattering particle SCT may be not disposed only in the third pixel PXL3, and may be selectively included in the first color conversion layer CCL1 or the second color conversion layer CCL2. In another embodiment, the light scattering particle SCT may be omitted such that the light scattering layer LSL including transparent polymer is provided.

A first capping layer CPL1 may be disposed on the color conversion layer CCL. The first capping layer CPL1 may be provided through the first to third pixels PXL1, PXL2, and PXL3. The first capping layer CPL1 may cover the color conversion layer CCL. The first capping layer CPL1 may prevent the color conversion layer CCL from being damaged or contaminated due to infiltration of an impurity such as moisture, air, or the like from an outside.

The first capping layer CPL1 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), the like, or a combination thereof.

The optical layer OPL may be disposed on the first capping layer CPL1. The optical layer OPL may improve light extraction efficiency by recycling light provided from the color conversion layer CCL through total reflection. For example, the optical layer OPL may have a refractive index relatively less than a refractive index of the color conversion layer CCL. For example, the refractive index of the color conversion layer CCL may be in a range of about 1.6 to about 2.0, and the refractive index of the optical layer OPL may be in a range of about 1.1 to about 1.3.

A second capping layer CPL2 may be disposed on the optical layer OPL. The second capping layer CPL2 may be provided throughout the first to third pixels PXL1, PXL2, and PXL3. The second capping layer CPL2 may cover the optical layer OPL. The second capping layer CPL2 may prevent the optical layer OPL from being damaged or contaminated due to infiltration of an impurity such as moisture or air from an outside.

The second capping layer CPL2 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), the like, or a combination thereof.

A planarization layer PLL may be disposed on the second capping layer CPL2. The planarization layer PLL may be provided throughout the first to third pixels PXL1, PXL2, and PXL3.

The planarization layer PLL may include an organic material such as an acrylic resin, an epoxy resin, a phenolic resin, a polyamide resin, a polyimide resin, an unsaturated polyester resin, a poly-phenylene ether resin, a poly-phenylene sulfide resin, benzocyclobutene (BCB), the like, or a combination thereof. However, the disclosure is not necessarily limited thereto, and in another embodiment, the planarization layer PLL may include an inorganic insulating material such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), or a combination thereof.

The color filter layer CFL may be disposed on the planarization layer PLL. The color filter layer CFL may include color filters CF1, CF2, and CF3 according to a color of each pixel PXL. The color filters CF1, CF2, and CF3 according to colors of the first to third pixels PXL1, PXL2, and PXL3 may be disposed, and a full-color image may be displayed.

The color filter layer CFL may include a first color filter CF1 disposed in the first pixel PXL1 that selectively transmits light emitted from the first pixel PXL1 through the first color filter CF1, a second color filter CF2 disposed in the second pixel PXL2 that selectively transmits light emitted from the second pixel PXL2 through the second color filter CF2, and a third color filter CF3 disposed in the third pixel PXL3 that selectively transmits light emitted from the third pixel PXL3 through the third color filter CF3.

In an embodiment, the first color filter CF1, the second color filter CF2, and the third color filter CF3 may be respectively a red color filter, a green color filter, and a blue color filter, but the disclosure is not necessarily limited thereto. Hereinafter, in case that at least one of the first color filter CF1, the second color filter CF2, and the third color filter CF3 is designated or in case that at least two of color filters are inclusively designated, the corresponding color filter or the corresponding color filters will be referred to as a "color filter CF" or "color filters CF."

The first color filter CF1 may overlap the first color conversion layer CCL1 of the first pixel PXL1 in the third direction (Z-axis direction). The first color filter CF1 may include a color filter material that selectively transmits light of a first color (or red) through the first color filter CF1. For example, in case that the first pixel PXL1 is a red pixel, the first color filter CF1 may include a red color filter material.

The second color filter CF2 may overlap the second color conversion layer CCL2 of the second pixel PXL2 in the third direction (Z-axis direction). The second color filter CF2 may include a color filter material that selectively transmits light of a second color (or green) through the second color filter CF2. For example, in case that the second pixel PXL2 is a green pixel, the second color filter CF2 may include a green color filter material.

The third color filter CF3 may overlap the light scattering layer LSL of the third pixel PXL3 in the third direction (Z-axis direction). The third color filter CF3 may include a color filter material that selectively transmits light of a third color (or blue) through the third color filter CF3. For example, in case that the third pixel PXL3 is a blue pixel, the third color filter CF3 may include a blue color filter material.

In an embodiment, a light blocking layer BM may be further disposed between the first color filter CF1, the second color filter CF2, and the third color filter CF3. As such, in case that the light blocking layer BM is formed between the first to third color filters CF1, CF2, and CF3, a color mixture defect viewed at the front or side of the display device may be prevented. However, the material of the light blocking layer BM is not particularly limited thereto, and the light blocking layer BM may include various light blocking materials. In an embodiment, the light blocking layer BM may be implemented by stacking the first to third color filters CF1, CF2, and CF3.

An overcoat layer OC may be disposed on the color filter layer CFL. The overcoat layer OC may be provided throughout the first to third pixels PXL1, PXL2, and PXL3. The overcoat layer OC may cover a lower member including the color filter layer CFL. The overcoat layer OC may prevent moisture or air from infiltrating into the lower member. The overcoat layer OC may protect the lower member from a foreign matter such as dust or the like.

The overcoat layer OC may include an organic material such as an acrylic resin, an epoxy resin, a phenolic resin, a polyamide resin, a polyimide resin, an unsaturated polyester resin, a poly-phenylene ether resin, a poly-phenylene sulfide resin, benzocyclobutene (BCB), the like, or a combination thereof. However, the disclosure is not necessarily limited thereto, and in another embodiment, the overcoat layer OC may include an inorganic insulating material such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), titanium oxide ($TiO_x$), the like, or a combination thereof.

In accordance with the disclosure, the indium (In) content and thickness of an active layer 12 of the light emitting element LD may be controlled, and reliability deterioration due to surface damage of the light emitting element LD may be minimized.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a first electrode and a second electrode, spaced apart from each other; and
light emitting elements disposed between the first electrode and the second electrode, wherein
each of the light emitting elements includes:
a first semiconductor layer;

a second semiconductor layer disposed on the first semiconductor layer; and an active layer disposed between the first semiconductor layer and the second semiconductor layer, a thickness of the active layer is in a range of about 1 nm to about 2.8 nm, the active layer includes $InGa_{1-x}N$ (about $0.18 \le x \le$ about 0.20), and the light emitting elements emit light with a wavelength in a range of about 462 nm to about 472 nm in a current density in a range of about 0.5 A/cm$^2$ to about 100 A/cm$^2$.

2. The display device of claim 1, wherein the first electrode overlaps the first semiconductor layer in a plan view, and the second electrode overlaps the second semiconductor layer in a plan view.

3. The display device of claim 2, further comprising:

a first connection electrode and a second connection electrode, disposed on the light emitting elements.

4. The display device of claim 3, wherein the first connection electrode is electrically connected to the first semiconductor layer, and the second connection electrode is electrically connected to the second semiconductor layer.

5. The display device of claim 3, wherein the first connection electrode is electrically connected to the first electrode, and the second connection electrode is electrically connected to the second electrode.

6. The display device of claim 1, further comprising:

a color conversion layer disposed on the light emitting elements.

7. The display device of claim 6, wherein the color conversion layer includes a first color conversion layer, a second color conversion layer, and a light scattering layer.

8. The display device of claim 7, wherein the first color conversion layer includes a first quantum dot, and the second color conversion layer includes a second quantum dot.

9. The display device of claim 7, wherein the light scattering layer includes a light scattering particle.

10. The display device of claim 7, further comprising:

a color filter layer disposed on the color conversion layer.

11. The display device of claim 10, wherein the color filter layer includes:

a first color filter overlapping the first color conversion layer in a plan view;

a second color filter overlapping the second color conversion layer in a plan view; and a third color filter overlapping the light scattering layer in a plan view.

12. The display device of claim 11, further comprising:

a light blocking layer disposed between the first, second, and third color filters.

13. The display device of claim 1, wherein the thickness of the active layer is in a range of about 1 nm to about 2.4 nm.

14. The display device of claim 1, wherein the light emitting elements emit light with a wavelength in a range of about 466 nm to about 469 nm in a current density of about 12 A/cm$^2$.

15. The display device of claim 1, wherein a thickness of each of the light emitting elements is less than or equal to about 4 μm.

16. A light emitting element comprising:

a first semiconductor layer;

a second semiconductor layer disposed on the first semiconductor layer; and an active layer disposed between the first semiconductor layer and the second semiconductor layer, wherein a thickness of the active layer is in a range of about 1 nm to about 2.8 nm, the active layer includes $InGa_{1-x}N$ (about $0.18 \le x \le$ about 0.20), and the light emitting element emits light with a wavelength in a range of about 462 nm to about 472 nm in a current density in a range of about 0.5 A/cm$^2$ to about 100 A/cm$^2$.

17. The light emitting element of claim 16, wherein the thickness of the active layer is in a range of about 1 nm to about 2.4 nm.

18. The light emitting element of claim 16, wherein the light emitting element emits light with a wavelength in a range of about 466 nm to about 469 nm in a current density of about 12 A/cm$^2$.

19. The light emitting element of claim 16, further comprising:

an electrode layer disposed on the first semiconductor layer.

20. The light emitting element of claim 16, further comprising:

an insulative film surrounding the first semiconductor layer, the active layer, and the second semiconductor layer.

* * * * *